United States Patent [19]
Maruyama et al.

[11] Patent Number: 6,148,185
[45] Date of Patent: *Nov. 14, 2000

[54] FEED-FORWARD AMPLIFYING DEVICE AND METHOD OF CONTROLLING THE SAME AND BASE STATION WITH FEED-FORWARD AMPLIFYING DEVICE

[75] Inventors: Satoshi Maruyama; Tokihiro Miyo; Fumihiko Kobayashi; Tatsuo Furukawa; Norio Tazawa, all of Kawasaki; Yasushi Seino, Sendai, all of Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/594,828

[22] Filed: Jan. 31, 1996

[30] Foreign Application Priority Data

Apr. 18, 1995 [JP] Japan ..................... 7-092851
Oct. 23, 1995 [JP] Japan ..................... 7-274599

[51] Int. Cl.$^7$ ..................................... H04B 17/00
[52] U.S. Cl. ................. 455/115; 455/304; 330/52; 330/151
[58] Field of Search ................. 455/33.1, 53.1, 455/67.1, 295, 115–116, 303–304, 127; 330/151, 149, 52; 327/233, 237, 248; H04B 17/00

[56] References Cited

U.S. PATENT DOCUMENTS

| | | | |
|---|---|---|---|
| 5,166,634 | 11/1992 | Narahahi et al. | 330/151 |
| 5,230,082 | 7/1993 | Ghisler et al. | 455/33.2 |
| 5,355,519 | 10/1994 | Hasegawa | 455/52.3 |
| 5,493,252 | 2/1996 | Takai | 330/52 |
| 5,515,000 | 5/1996 | Maruyama et al. | 330/52 |
| 5,532,642 | 7/1996 | Takai | 330/52 |
| 5,565,814 | 10/1996 | Fukuchi | 330/151 |
| 5,610,554 | 3/1997 | Anvari | 330/52 |

FOREIGN PATENT DOCUMENTS 404286209   3/1991   Japan ..................... H03F 1/32

Primary Examiner—Andrew I. Faile
Assistant Examiner—Vincent F. Boccio
Attorney, Agent, or Firm—Helfgott & Karas, P.C.

[57] ABSTRACT

The present invention relates to a feed-forward amplifying device suitable for radio communication systems such as digital automobile telephone. In the feed-forward amplifying device which includes a distortion extracting loop circuit unit including a main amplifier which amplifies a main signal in a main signal system, the distortion extracting loop circuit unit creating a distortion extracting signal by controlling the phase of the main signal the distortion extracting signal obtained by canceling the main signal component of an output from the main amplifier; and a distortion removing loop circuit unit arranged at the rear stage of the main amplifier, the distortion removing loop circuit unit producing only the main signal component from a signal in the main signal system at the rear stage of the main amplifier using the distortion extracting signal obtained by canceling the main signal component, the distortion extracting loop circuit unit executes phase control by shifting a phase control point where the main signal can be most canceled, thus creating the distortion extracting signal. This device can improve the power efficiency with a small back-up of the amplifier and stably produce a low-distortion amplified signal.

13 Claims, 17 Drawing Sheets

F I G. 12
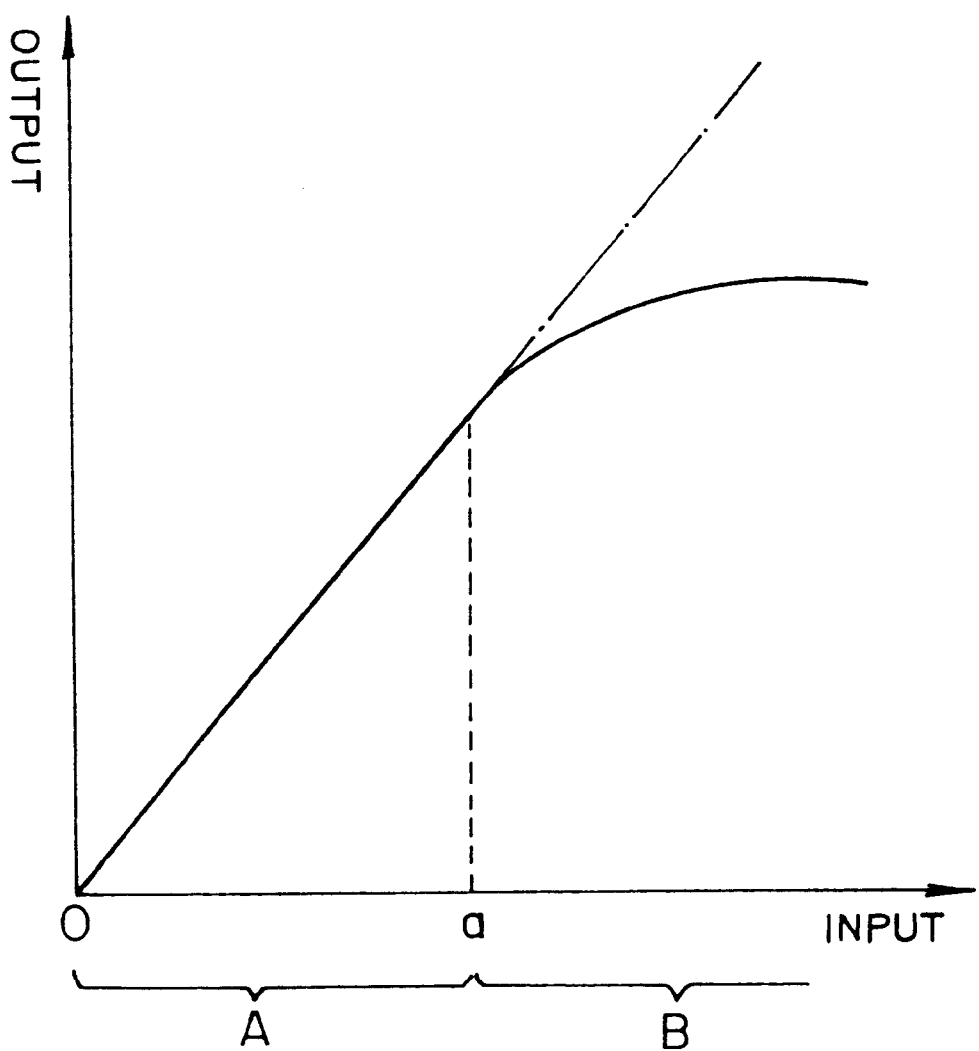

F I G. 17
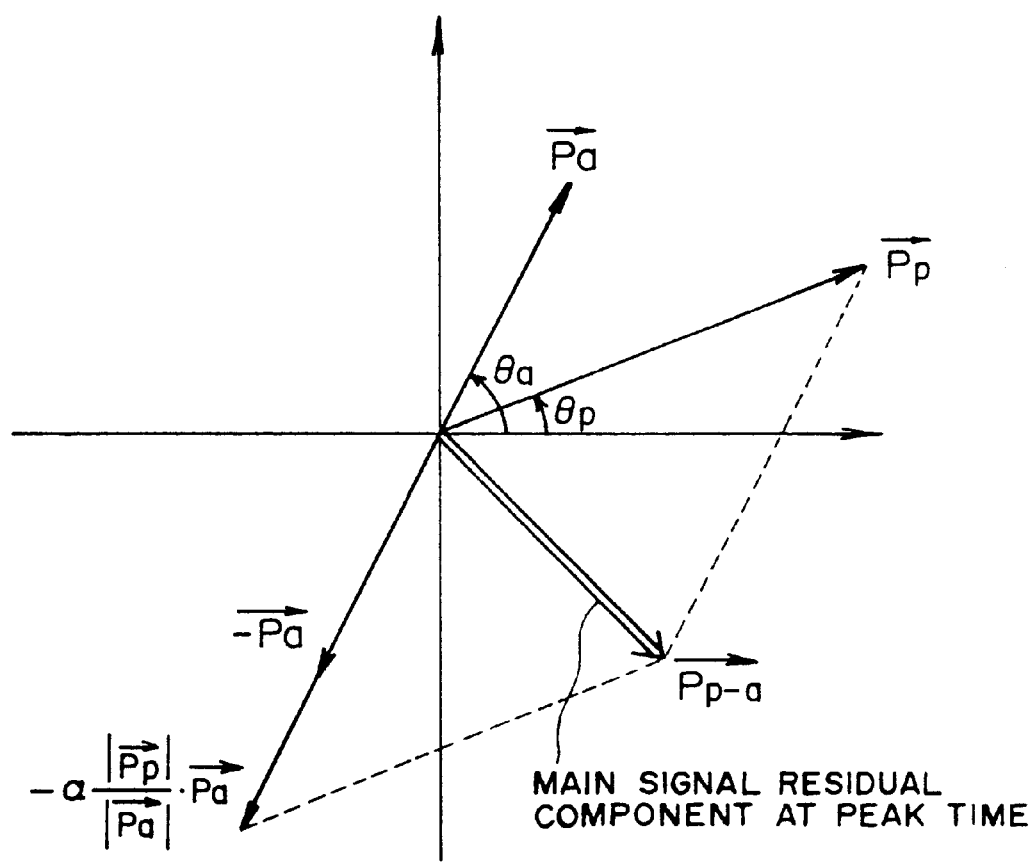

FEED-FORWARD AMPLIFYING DEVICE AND METHOD OF CONTROLLING THE SAME AND BASE STATION WITH FEED-FORWARD AMPLIFYING DEVICE

BACKGROUND OF THE INVENTION

1) Field of the Invention

The present invention relates to a feed-forward amplifying device suitable for radio equipment arranged in a base station in radio telecommunication systems such as digital automobile telephones, a method for controlling the same, and a base station with the feed-forward amplifying device.

2) Description of the Related Art

In the radio equipment of a base station in a radio communication system such as digital automobile telephone system, a multicarrier (a signal including plural frequency components selected every mobile unit at a used frequency band) is amplified in common for transmission to mobile units.

In a general amplifier used in the above-mentioned amplifying device, it is regarded that the output signal level increases linearly at a low input signal level, as shown in FIG. 12. As the input signal level, however, increases, the non-linear characteristic becomes noticeable (at the level exceeding the point a, for example, shown in FIG. 12).

Where the common amplification is performed in the above-mentioned radio equipment, a low-distortion amplifying device is particularly required because the intermodulation distortion component interferes with other channels.

FIG. 13 is a block diagram illustrating a transmitter equipped at a base station accommodating plural mobile units in a radio communication system such as a digital automobile telephone system. The transmitter 200 shown in FIG. 13 can amplify and transmit in common, for example, 12 kinds of frequency signals.

In the transmitter 200, numeral 201 represents a demultiplexer (DMUX) which separates a transmission signal every carrier; 202-1 to 202-12 represents a direct modulating unit that modulates each duplex carrier and subjects a high-frequency signal to a frequency conversion; and 203 represents a hybrid circuit (H) that combines signals from the direct modulating units 202-1 to 202-12 together.

Numeral 206 represents an amplifying device. The amplifying device 206 amplifies in common a transmission signal as a multicarrier signal sent to the mobile units 209 accommodated in the transmitter 200. The amplifier 206 includes two amplifiers 204-1 and 204-2 and switches 205a to 205d.

Two amplifiers 204-1 and 204-2 receive an input signal with a level in the area A shown in FIG. 12, with a fixed de power supplied thereto, and amplifies and produces it with a fixed amplifying factor according to the de power. A control unit (not shown) on/off controls the switches 205a to 205d according to the power of the transmission signal output from the hybrid circuit 203.

In concrete, when the power of the transmission signal from the hybrid circuit 203 is low, only the amplifier 204-1 is operated by turning on the switches 205a and 205b and turning off the switches 205c and 205d. When the power of the transmission signal from the hybrid circuit 203 is high, both the amplifiers 204-1 and 204-2 are operated by turning on all the switches 205a to 205d.

Numeral 207 represents a transmit/receive shared unit that outputs a transmission signal from the amplifying device 206 to the antenna 208 arranged at the rear stage. The signal from the mobile unit 209 received by the antenna 208 is transmitted to the receiving system (not shown) via the transmit/receive shared unit 207.

In the transmitter 200 shown in FIG. 13, the amplifying unit 206 amplifies a multicarrier signal carrying 12 kinds of frequency signals according to the signal power and then transmits the result. The amplifiers 204-1 and 204-2 amplify linearly the transmission signal according to the input signal level so that an intermodulation distortion component such as amplitude change and phase shift is suppressed.

The dc power supplied to the amplifiers 204-1 and 204-2 is sufficiently larger than the output signal power. The heat dissipation fin (not shown) equipped to the amplifiers 204-1 and 204-2 converts the residual component being a difference between the supplied power and the signal power of the amplifiers 204-1 and 204-2 into heat energy and radiates it.

With an input signal in the level of the area A shown in FIG. 12, since an output signal is low in level, the dc power supplied cannot sufficiently converted as a power energy. Hence there is a problem in the power use efficiency.

On the other hand, it may be considered to use the transmitter 200A shown in FIG. 14 including the amplifying device 206A formed of a sole amplifier 204A. The reason is that the supplied dc power can be sufficiently used as power energy by inputting the input signal to the amplifier 204A in the vicinity of the saturated level as shown with the region B in FIG. 12 even when the signal output of the hybrid circuit 203 is small.

However, in the transmitter 200A shown in FIG. 14, the problem is that the intermodulation distortion component such as amplitude change or phase shift becomes large since the amplifier 204A amplifies non-linearly a transmission signal as shown with the region B in FIG. 12.

Moreover, it is considered to suppress the intermodulation distortion component such as amplitude change or phase shift by subjecting the feed-forward amplifying device including a sole amplifier shown in FIG. 15 to a feed-forward control.

The feed-forward amplifying device shown in FIG. 15, which can be equipped to the amplifying device 206A of the transmitter 200A in a base station which accommodates plural mobile units in a radio communication system such as a digital automobile system, shown in FIG. 14, can amplify in common the transmission signal to mobile units 209 as a multicarrier signal.

Referring to FIG. 15, numeral 101 represents a distortion extracting loop circuit unit. The distortion extracting loop circuit unit 101 extracts a distortion component included in the main signal output from the main amplifier 104. The distortion extracting loop circuit unit 101 includes the branching unit 102, the variable phase shifter and variable attenuator 103, the attenuator 105, the delay line 106, and the synthesizing unit 107, in addition to the main amplifier 104.

The branching unit 102 branches the main signal at the previous stage of the main amplifier 104. The variable phase shifter and variable attenuator (PSV1/AV1) 103 varies the phase and amplitude of a main signal branched by the branching unit 102 according to the control signal from the CPU 115 (to be described later) and then produces the result to the main amplifier 104.

The attenuator 105 receives the main signal amplified by the main amplifier 104 and a pilot signal supplied from the pilot signal generating unit 100 and then attenuates them to the level before they are amplified. The delay line 106 delays another main signal branched by the branching unit 104 by a predetermined period of time. The synthesizing unit 107 synthesizes a signal from the attenuator 105 with the signal from the delay line 106 and then produces the result as a distortion extracting signal.

Numeral 108 represents a distortion removing loop circuit unit. The distortion removing loop circuit unit 108 produces only the main signal component of the signal in the main signal system at the rear stage of the main amplifier 104, using the distortion extracting signal obtained by canceling the main signal component from the distortion extracting loop circuit unit 101. The distortion removing loop circuit unit 108 includes the delay line 109, the variable phase shifter and variable attenuator 110, the auxiliary amplifier 111, and the synthesizer 112.

The delay line 109 delays a signal amplified by the main amplifier 104 by a predetermined time. The variable phase shifter and variable attenuator (PSV2/AV2) 110 varies the phase and amplitude of the distortion extracting signal from the synthesizing unit 107, based on the control signal from the CPU 115 (to be described later).

The auxiliary amplifier 111 amplifies the distortion extracting signal from the variable phase shifter and variable attenuator 110. The synthesizing unit 112 synthesizes the signal from the delay line 109 with the signal amplified by the auxiliary amplifier 111 and then produces the result as a distortion removing signal (main signal).

Numeral 113 represents a detector which receives the distortion extracting signal output from synthesizing unit 107 and detects the main signal component included in the distortion extracting signal. Numeral 114 represents a detector that detects the distortion signal component (a component other than the main signal component) included in the distortion removing signal input from the synthesizing unit 112.

The CPU 115 controls the variable phase shifter and variable attenuator 103 according to the detection level of a pilot signal of the detector 114 to convert the signal output from the synthesizing unit 107 into a distortion extracting signal of which the main signal distortion signal component is most canceled (or canceled maximumly), and controls the variable phase shifter and variable attenuator 110 to convert the distortion removing signal output from the synthesizing unit 112 into a main signal of which the distortion signal component is best canceled (or canceled maximumly).

In the feed-forward amplifying device having the configuration shown in FIG. 15, the distortion extracting loop circuit unit 101 receives a multicarrier signal and produces a distortion extracting signal of which the main signal component is canceled maximumly, under the control of the CPU 115. The distortion removing loop circuit unit 108 produces the main signal of which the distortion signal component is canceled maximumly, under the control of the CPU 115.

Where the multicarrier signal is stably input to the feed-forward amplifying device, the phase and amplitude in the variable phase shifter and variable attenuators 103 and 110 can be controlled in a balanced state.

However, the multicarrier signal input to the general feed-forward amplifying device may be instantaneously produced at a peak power several times the average power. In the case of, for example, 8 multicarriers, the maximum value of the peak power increases instantaneously by about 8 dB, for example, to the average power.

The problem is that the loop circuit units 101 and 108 are unbalanced due to the nonlinear characteristic such as the AM-PM characteristic of the amplifier when the multicarrier signal is input at a peak power to the feed-forward amplifying device, whereby the distortion component of the output signal from the feed-forward amplifying device increases.

FIG. 16 is a diagram showing an example of the AM-PM characteristic of a general amplifier used in the main amplifier 104 or the auxiliary amplifier 111 mentioned above. FIG. 17 is a vector diagram showing an example of the characteristic shown in FIG. 16. Referring to FIG. 16, Pa represents an average input power of a multicarrier signal to the main amplifier 104 and θa represents a phase rotation of the main amplifier 104 at the power Pa. Hence, as shown, for example, in FIG. 17, the average input power (vector length) Pa and the phase rotation θa can be represented as the vector Pa.

In FIG. 17, the vector is shown with an arrow and the information on a vector length is represented with an absolute value of a vector. However, it should be noted that the notation is not limited only to this example.

Pp represents a peak level of a multicarrier signal and θp represents a phase rotation of the main amplifier at the power Pp. Hence, as shown in FIG. 17, the peak level (vector length) Pp and the phase rotation θp can be represented as the vector Pp. In this case, it is assumed that the distortion extracting loop circuit unit 101 which cancels the main signal is in a balanced state to the average input power Pa.

If the power of an input signal input to the main amplifier 104 is less than Pa, as shown in FIG. 16, the phase of the amplified signal acting as an output signal is near to θa, or does not nearly vary. When the power of the input signal is at the peak level Pp, the phase of the amplified signal acting as an output signal varies to θp, or rotates by $\Delta\theta = \theta a - \theta p$.

In this case, it is difficult to deal with the phase rotation Δθ of the amplified signal under the phase control of the variable phase shifter and variable attenuator 103. The cancel amount (the amount of the main signal component canceled) of the main signal due to the distortion extracting signal output from the distortion extracting loop circuit unit 101 decreases corresponding to the amount of Δθ. As a result, the main signal residual component at a peak time is the vector Pp-a [=vector Pp-α(Pp/Pa)·vector Pa] (where α is a coefficient representing the AM—AM characteristic of the main amplifier), for example, shown in FIG. 17.

The distortion extracting signal including the main signal component not canceled is input to the auxiliary amplifier 111 via the variable phase shifter and variable attenuator 110. Like the main amplifier 104, the auxiliary amplifier 111 varies its pass phase because of the non-linearity of the AM-PM characteristic.

It is difficult that the variable phase shifter and variable attenuator 110 deals with the phase variation of the amplified signal output from the auxiliary amplifier 111 so that the distortion removing loop circuit unit 108 is unbalanced. Moreover, since the distortion caused in the auxiliary amplifier 111 becomes an unignorable value, the distortion component included in the main signal acting as an output signal of the feed-forward amplifying device increases.

In other words, at a peak power time when an input multicarrier signal occurs instantaneously, it is difficult to make the distortion extracting loop circuit unit 101 and the distortion removing loop circuit unit 108 follow controlling the amplified signal. Thus the distortion component of the output from the feed-forward amplifying device increases because of deterioration of the distortion component canceling amount.

In order to avoid the distortion of an amplified signal at a peak power of a multicarrier signal, it may be considered that a point where the effect of the AM-PM characteristic does not extend (or where the power of an input signal is less than Pa) is selected as the operational point of the amplifier. However, this approach leads to a large back-off by which the amplification efficiency of the amplifier is decreased.

SUMMARY OF THE INVENTION

The present invention is made to overcome the above mentioned problems. An object of the present invention is to provide a feed-forward amplifying device that can stably provide a low distortion amplification signal by improving the amplification efficiency with a small back-off of an amplifier.

Another object of the present invention is to provide a feed-forward amplifying device controlling method which can stably provide a low distortion amplification signal by improving the amplification efficiency with a small back-off of an amplifier.

Further object of the present invention is to provide a base station with a feed-forward amplifying device that can stably provide a low distortion amplification signal by improving the amplification efficiency with a small back-off of an amplifier.

In order to achieve the above objects, according to the present invention, the feed-forward amplifying device is characterized by a distortion extracting loop circuit unit including a main amplifier which amplifies a main signal in a main signal system, the distortion extracting loop circuit unit creating a distortion extracting signal by controlling the phase of the main signal, the distortion extracting signal obtained by canceling the main signal component of an output from the main amplifier; and a distortion removing loop circuit unit arranged at the rear stage of the main amplifier, the distortion removing loop circuit unit producing only the main signal component from a signal in the main signal system at the rear stage of the main amplifier using the distortion extracting signal obtained by canceling the main signal component; the distortion extracting loop circuit unit executing phase control under which a phase control point where the main signal can be most canceled is shifted, thus creating the distortion extracting signal.

The present invention has the advantage of providing stably a low-distortion amplified signal by shifting the phase amount of a main signal branched in the branching unit by a predetermined amount using the phase adjusting unit and by improving the power efficiency with a small back-off of the amplifier.

According to the present invention, the feed-forward amplifying device is characterized by a distortion extracting loop circuit unit including a main amplifier for amplifying a main signal in a main signal system, a branching unit for branching a main signal of a previous stage of the main amplifier, a first variable phase shifter and variable attenuator for varying the phase and amplitude of a first main signal branched by the branching unit to output the resultant signal to the main amplifier, an attenuator for receiving the main signal amplified by the main amplifier and a pilot signal supplied from a pilot signal producing unit and then attenuating the resultant signals to levels of the signals before amplified, a first delaying unit for delaying a second main signal branched by the branching unit by a predetermined time, and a first synthesizing unit for synthesizing a signal from the attenuator with a signal from the first delaying unit and then producing the result as a distortion extracting signal; a distortion removing loop circuit unit including a second delaying unit for delaying a signal amplified by the main amplifier by a predetermined time, a second variable phase shifter and variable attenuator for varying the phase and amplitude of the distortion extracting signal from the first synthesizing unit, an auxiliary amplifier for amplifying the distortion extracting signal from the second variable phase shifter and variable attenuator with the same amplifying factor as that of the main amplifier, and a second synthesizing unit for synthesizing the signal from the second delaying unit with the signal amplified by the auxiliary amplifier; a control unit including a first control unit for controlling the first variable phase shifter and variable attenuator to convert the signal from the first synthesizing unit into a distortion extracting signal obtained by best canceling the main signal component, and a second control unit for controlling the second variable phase shifter and variable attenuator after the control operation of the first control unit to cancel components other than the main signal component of the signal output from the second synthesizing unit so that only the main signal component is obtained; and a phase adjusting unit for shifting the phase of the first main signal branched by the branching unit by a predetermined amount.

The present invention has the advantage of providing stably a low-distortion amplified signal by shifting the phase amount of a main signal branched in the branching unit by a predetermined amount using the phase adjusting unit and by improving the power efficiency with a small back-off of the amplifier.

According to the present invention, the method of controlling a feed-forward amplifying device which includes a distortion extracting loop circuit unit including a main amplifier which amplifies a main signal in a main signal system, the distortion extracting loop circuit unit creating a distortion extracting signal by controlling the phase of the main signal, the distortion extracting signal being obtained by canceling the main signal component of an output from the main amplifier; and a distortion removing loop circuit unit arranged at the rear stage of the main amplifier, the distortion removing loop circuit unit producing a signal obtained by canceling the main signal component of an output from the main amplifier, based on the output of the main amplifier and a distortion extracting signal from the distortion extracting loop circuit unit, and producing only the main signal component from a signal in the main signal system at the rear stage of the main amplifier using the signal obtained by canceling the main signal component, is characterized by the step of controlling such that the distortion extracting loop circuit unit shifts a phase control point where the main signal can be most canceled to control the phase and then creates the distortion extracting signal.

Hence, the present invention has the advantage of providing stably a low-distortion amplified signal by shifting the phase amount of a main signal branched in the branching unit by a predetermined amount using the phase adjusting unit and by improving the power efficiency with a small backoff of the amplifier.

According to the present invention, the method of controlling a feed-forward amplifying device including a distortion extracting loop circuit unit including a main amplifier for amplifying a main signal in a main signal system, a branching unit for branching a main signal at a previous stage of the main amplifier, a first variable phase shifter and variable attenuator for varying the phase and amplitude of a first main signal branched by the branching unit to output the resultant signal to the main amplifier, an attenuator for receiving the main signal amplified by the main amplifier and a pilot signal supplied from a pilot signal producing unit and then attenuating each resultant signal to a level of the signals before amplified, a first delaying unit for delaying a second main signal branched by the branching unit by a predetermined time, and a first synthesizing unit for synthesizing a signal from the attenuator with a signal from the first delaying unit, and a distortion removing loop circuit unit including a second delaying unit for delaying a signal amplified by the main amplifier by a predetermined time, a second variable phase shifter and variable attenuator for varying the phase and amplitude of the distortion extracting signal from the first synthesizing unit, an auxiliary amplifier for amplifying the distortion extracting signal from the second variable phase shifter and variable attenuator with the same amplifying factor as that of the main amplifier, and a second synthesizing unit for synthesizing the signal from the second delaying unit with the signal amplified by the auxiliary amplifier, is characterized by the step of controlling the first variable phase shifter and variable attenuator to convert a signal output from the first synthesizing unit into a distortion extracting signal obtained by best canceling the main signal component; controlling shifting the phase of the main signal by a predetermined amount by means of the phase adjusting unit; and controlling the second variable phase shifter and variable attenuator to convert a signal from the second synthesizing unit into only the main signal component obtained by best canceling components other than the main signal component.

Hence, the present invention has the advantage of providing stable a low-distortion amplified signal by shifting the phase amount of a main signal branched in the branching unit by a predetermined amount using the phase adjusting unit and by improving the power efficiency with a small back-off of the amplifier.

Furthermore, according to the present invention, the base station with a feed-forward amplifying device, the base station including plural mobile units, the base station amplifying and transmitting in common a signal having plural frequency components selected every mobile unit at a used frequency band when a signal is transmitted to the mobile units, the feed-forward amplifying device is characterized by a distortion extracting loop circuit unit including a main amplifier which amplifies a main signal in a main signal system, the distortion extracting loop circuit unit creating a distortion extracting signal by controlling the phase of the main signal, the distortion extracting signal obtained by canceling the main signal component of an output from the main amplifier; and a distortion removing loop circuit unit arranged at the rear stage of the main amplifier, the distortion removing loop circuit unit producing only the main signal component from a signal in the main signal system at the rear stage of the main amplifier using the distortion extracting signal obtained by canceling the main signal component; the distortion extracting loop circuit unit executing phase control by shifting a phase control point where the main signal can be canceled, thus creating the distortion extracting signal.

Hence, the present invention has the advantage of providing stably a low-distortion amplified signal by shifting the phase amount of a main signal branched in the branching unit by a predetermined amount using the phase adjusting unit in the feed-forward amplifying device and by improving the power efficiency with a small back-off of the amplifier. Particularly, with the feed-forward amplifying device used at a base station where the multicarrier signal is amplified, the intermodulation distortion component of a transmission signal can be suppressed, so that no interference between channels results in suppressing the noise component of a transmission signal.

According to the present invention, the base station with a feed-forward amplifying device, the base station including plural mobile units, the base station amplifying and transmitting in common a signal having plural frequency components selected every mobile unit at a used frequency band when a signal is transmitted to the mobile units, the feed-forward amplifying device is characterized by a distortion extracting loop circuit unit including a main amplifier for amplifying a main signal in a main signal system, a branching unit for branching a main signal at a previous stage of the main amplifier, a first variable phase shifter and variable attenuator for varying the phase and amplitude of a first main signal branched by the branching unit to output the resultant signal to the main amplifier, an attenuator for receiving the main signal amplified by the main amplifier and a pilot signal supplied from a pilot signal producing unit and then attenuating each resultant signal to a level before amplified, a first delaying unit for delaying a second main signal branched by the branching unit by a predetermined time, and a first synthesizing unit for synthesizing a signal from the attenuator with a signal from the first delaying unit; a distortion removing loop circuit unit including a second delaying unit for delaying a signal amplified by the main amplifier by a predetermined time, a second variable phase shifter and variable attenuator for varying the phase and amplitude of the distortion extracting signal from the first synthesizing unit, an auxiliary amplifier for amplifying the distortion extracting signal from the second variable phase shifter and variable attenuator with the same amplifying factor as that of the main amplifier, and a second synthesizing unit for synthesizing the signal from the second delaying unit with the signal amplified by the auxiliary amplifier; a control unit including: a first control unit for controlling the first variable phase shifter and variable attenuator to convert the signal from the first synthesizing unit into a distortion extracting signal obtained by best canceling the main signal component, and a second control unit for controlling the second variable phase shifter and variable attenuator after the control of the first control unit to cancel components other than the main signal component of the signal output from the second synthesizing unit so that only the main signal component is obtained; and a phase adjusting unit for shifting the phase of the first main signal branched by the branching unit by a predetermined amount.

Hence, the present invention has the advantage of providing stably a low-distortion amplified signal by shifting the phase amount of a main signal branched in the branching unit by a predetermined amount using the phase adjusting unit in the feed-forward amplifying device and by improving the power efficiency with a small back-off of the amplifier. Particularly, with the feed-forward amplifying device used at a base station where the multicarrier signal is amplified, the intermodulation distortion component of a transmission signal can be suppressed, so that no interference between channels results in suppressing the noise component of a transmission signal.

BRIEF DESCRIPTION OF THE DRAWINGS

FIG. 12 is a diagram illustrating an amplification characteristic of a general amplifier;

FIG. 17 is a vector diagram showing an example of the AM-PM characteristic of a general amplifier.

DESCRIPTION OF THE PREFERRED EMBODIMENTS (a) Aspect of the Present Invention:

The aspect of the present invention will be explained below with reference to the attached drawings.

Figure 1:
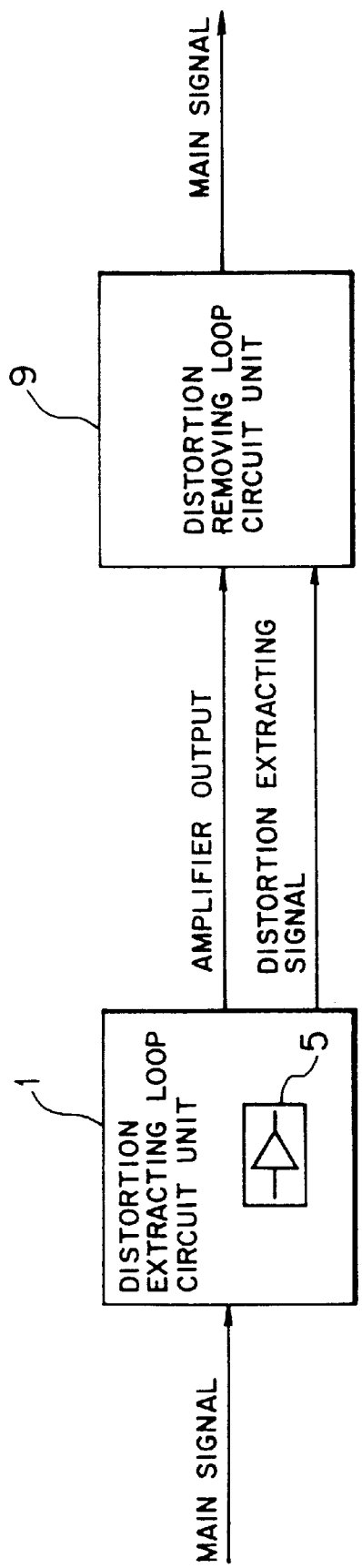
FIG. 1 is a block diagram showing the first aspect of the present invention.

FIG. 1 is a block diagram showing the first aspect of the present invention. Referring to FIG. 1, numeral 1 represents a distortion extracting loop circuit unit. The distortion extracting loop circuit unit 1 creates a distortion extracting signal obtained by canceling the main signal component of an output from the main amplifier 5 which amplifies the main signal in a main signal system, under the main signal phase control.

In order to create a distortion extracting signal, the distortion extracting loop circuit unit 1 controls the phase at a point shifted from the phase control point where the main signal is most canceled.

Numeral 9 represents a distortion removing loop circuit unit. The distortion removing loop circuit unit 9 produces only the main signal component of a signal in the main signal system at the rear stage of the main amplifier 5, using the distortion extracting signal obtained by canceling the main signal component at the rear stage of the main amplifier 5.

The feed-forward amplifying device can be used in a base station accommodating plural mobile units which amplifies and transmits in common a signal having plural frequency components selected every mobile unit in a used frequency band to transmit a signal to a mobile unit.

According to the first aspect, as shown in FIG. 1, the distortion extracting loop circuit unit 1 creates a distortion extracting signal obtained by canceling the main signal component of an output from the main amplifier 5 amplifying the main signal in the main signal system, under a main signal phase control. The phase control under which the distortion extracting loop circuit unit 1 creates a distortion extracting signal is performed by shifting the phase control point where the main signal is most canceled.

The distortion removing loop circuit unit 9 produces only the main signal component of a signal in the main signal system at the rear stage of the main amplifier 5, using a distortion extracting signal obtained by canceling the main signal component at the rear stage of the main amplifier 5.

Likewise, the above-mentioned operating is realized by applying the feed-forward amplifying device to a base station which accommodates plural mobile units and amplifies and transmits a signal having plural frequency components selected every mobile unit at a used frequency band when a signal is transmitted to a mobile unit.

Figure 2:
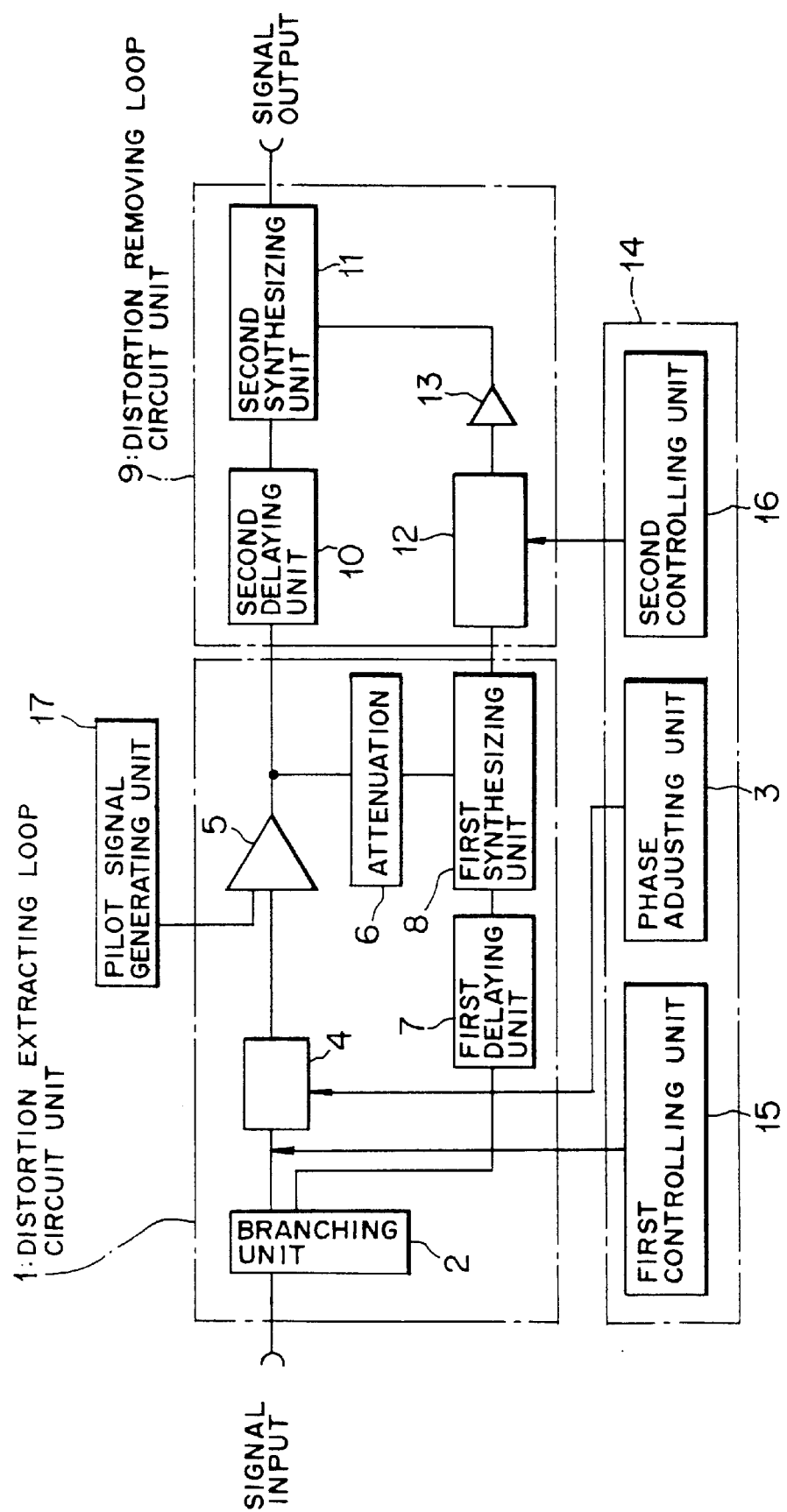
FIG. 2 is a block diagram showing the second aspect of the present invention.

FIG. 2 is a block diagram illustrating the second aspect of the present invention. Referring to FIG. 2, numeral 5 represents a main amplifier which amplifies the main signal in the main signal system.

Numeral 1 represents a distortion extracting loop circuit unit. The distortion extracting loop circuit unit 1 includes a branching unit 2, a first variable phase shifter and variable attenuator 4, an attenuator 6, a first delaying unit 7, and a first synthesizing unit 8, in addition to the main amplifier 5.

The branching unit 2 branches the main signal at the previous stage of the main amplifier 5. The first variable phase shifter and variable attenuator 4 varies the phase and amplitude of a main signal branched by the branching unit 2 and then outputs the result to the main amplifier 5.

The attenuator 6 receives a main signal amplified by the main amplifier 5 and a pilot signal supplied from the pilot signal generating unit 17 and attenuates the signals to the level before they are amplified.

The first delaying unit 7 delays another main signal branched by the branching unit 2 by a predetermined time. The first synthesizing unit 8 synthesizes a signal from the attenuator 2 with a signal from the first delaying unit 7 and produces the result as a distortion extracting signal.

The numeral 9 represents a distortion removing loop circuit unit. The distortion removing loop circuit unit 9 includes a second delaying unit 10, a second synthesizing unit 11, a second variable phase shifter and variable attenuator 12, and an auxiliary amplifier 13.

The second delaying unit 10 delays an amplified signal from the main amplifier 5 by a predetermined time. The second variable phase shifter and variable attenuator 12 varies the phase and amplitude of a distortion extracting signal from the first synthesizing unit 8.

The auxiliary amplifier 13 amplifies the distortion extracting signal from the second variable phase shifter and variable attenuator 12 with the same amplifying factor as that of the main amplifier 5. The second synthesizing unit 11 synthesizes a signal from the second delaying unit 10 with a signal amplified by the auxiliary amplifier 13.

The control unit 14 includes a first control unit 15 which controls the first variable phase shifter and variable attenuator 4 to convert a signal from the first synthesizing unit 8 into a distortion extracting signal obtained by most canceling the main signal component, and a second control unit 16 which controls the second variable phase shifter and variable attenuator 12 to convert a signal from the second synthesizing unit 11 into only the main signal component obtained by most canceling components other than main signal component.

Numeral 3 represents a phase adjusting unit. The phase adjusting unit 3 shifts the phase of a main signal branched by the branching unit 2 by a predetermined amount.

Under the control of the first control unit 15, the phase adjusting unit 3 shifts the phase of a main signal by a predetermined amount. Then the second control unit 16 performs a control operation for a predetermined time. The control unit 14 repeats sequentially control of the first control unit 15, control of shifting the phase of a main signal by a predetermined amount using the phase adjusting unit 3, and control of the second control unit 16.

In this case, the feed-forward amplifying device may include a monitoring unit that monitors a control abnormality and the level of an uncanceled signal, based on the signal from the distortion extracting loop circuit unit 1 and the signal from the distortion removing loop circuit unit 9, and a control mode varying unit that forcibly changes to a control mode by the control unit 15 when the monitoring unit detects an abnormal state.

The phase adjusting unit 3 may include a phase information setting unit that sets phase information on shifting the phase of a main signal by a predetermined amount in the form of an analog voltage, an adder that adds the phase information set by the phase information setting unit to the phase control amount of the first control unit 15 in an analog form to output the result to the first variable phase shifter and variable attenuator 4, and a switch arranged between the phase information setting unit and the adder to turn on at shifting the phase of a main signal by a predetermined amount and turned off at other operations.

The phase adjusting unit 3 may include a phase information storing unit for storing phase information on shifting the phase of the main signal by a predetermined amount in the form of an analog voltage; a phase information adder for adding phase information from the phase information storing unit to phase control amount from the first control unit to the first variable phase shifter and variable attenuator; and a phase adjusting and controlling unit for shifting the phase of the main signal by a predetermined amount according to the phase information added by the phase information adder. The phase adjusting unit also may include a phase information setting unit for setting phase information on shifting the phase of the main signal by a predetermined amount in the form of an analog voltage; an A/D converter for A/D converting an analog voltage value set by the phase information setting unit; a phase information adder for adding phase information A/D converted in the A/D converter to phase control amount output from the first control unit to the first variable phase shifter and variable attenuator; and a phase adjusting and controlling unit for shifting the phase of the main signal by a predetermined amount based on the phase information added by the phase information adder.

The feed-forward amplifying device shown in FIG. 2 can be applied to a base station which amplifies and transmits in common plural frequency components selected every mobile device at a used frequency band when a signal is transmitted to said mobile device.

According to the second aspect of the present invention, as shown in FIG. 2, the branching unit 2 within the distortion extracting loop circuit unit 1 branches the main signal at the previous stage of the main amplifier 5 and the first variable phase shifter and variable attenuator 4 varies the phase and amplitude of a main signal branched by the branching unit 2 and then outputs the result to the main amplifier 5.

The attenuator 6 attenuates a main signal amplified by the main amplifier 5 and a pilot signal supplied from the pilot signal producing unit 17 to the levels before they are amplified and then produces the result to the first synthesizing unit 8.

The first delaying unit 7 delays another main signal branched by the branching unit 2 by a predetermined time and then outputs the result to the first synthesizing unit 8. The first synthesizing unit 8 synthesizes a signal from the attenuator 2 with a signal from the first delaying unit 7 and then outputs the result as a distortion extracting signal.

The second delaying unit 10 in the distortion removing loop circuit unit 9 delays a signal amplified by the main amplifier 5 by a predetermined time and then output the result to the second synthesizing unit 11.

Furthermore, the second variable phase shifter and variable attenuator 12 varies the phase and amplitude of the distortion extracting signal from the first synthesizing unit. Then the coupler 32 cancels the distortion of the main signal. The second synthesizing unit 11 synthesizes a signal from the second delay signal 10 with a signal amplified by the auxiliary amplifier 13.

The first control unit 15 in the control unit 14 controls the first variable phase shifter and variable attenuator 4 to convert the signal from the first synthesizing unit 8 into a distortion extracting signal obtained by most canceling the main signal component. After the control of the first control unit 15, the second control unit 16 controls the second variable phase shifter and variable attenuator 12 to convert a signal from the second synthesizing unit 11 into only the main signal component in which the other components except the main signal component are most canceled.

The phase adjusting unit 3 shifts the phase of a main signal branched by the branching unit 2 by a predetermined amount.

When the first control unit 15 executes a control operation, the phase adjusting unit 3 shifts the phase of the main signal by a predetermined amount. Then the second control unit 16 executes a control operation for a predetermined period of time while the control unit 14 repeats sequentially control of the first control unit 15, control of shifting the phase of a main signal by a predetermined amount by means of the phase adjusting unit 3, and control of the second control unit 16.

In this case, the feed-forward amplifying device may further include a monitoring unit for monitoring a control abnormality and the level of an uncanceled signal based on a signal from the distortion extracting loop circuit unit 1 and a signal from the distortion removing loop circuit unit 9; and a control mode varying unit for forcibly varying the control mode to that of the first controlling unit 15 when the monitoring unit has detected an abnormal state.

Furthermore, in the phase adjusting unit 3, a phase information setting unit sets phase information on shifting the phase of the main signal by a predetermined amount in the form of an analog voltage. An adder analog-adds phase information set by the phase information setting unit to phase control amount set by the first control unit 15 and then outputs the result to the first variable phase shifter and variable attenuator 4. A switch arranged between the phase information setting unit and the adder turns on to shift the phase of the main signal by a predetermined amount and turns off in other operations.

In the phase adjusting unit, the phase information storing unit can store phase information on shifting the phase of the main signal by a predetermined amount. The phase information adder can add phase information from the phase information storing unit to a phase control amount sent from the first control unit to the first variable phase shifter and variable attenuator. The phase adjusting and controlling unit can shift the phase of the main signal by a predetermined amount according to the phase information added by the phase information adder.

In the phase adjusting unit 3, the phase information setting unit sets phase information on shifting the phase of the main signal by a predetermined amount in the form of an analog voltage. The A/D converter A/D converts an analog voltage value set by the phase information setting unit. The phase information adder adds phase information A/D converted in the A/D converter to a phase control amount output from the first control unit to the first variable phase shifter and variable attenuator. The phase adjustment control unit shifts the phase of the main signal by a predetermined amount based on the phase information added by the phase information adder.

The same operation can be realized by applying the feed-forward amplifying device shown in FIG. 2 to a base station which includes plural mobile devices amplifies and transmits in common plural frequency components selected every mobile device at a used frequency band when a signal is transmitted to the mobile device.

Therefore the present invention has the advantage of providing a low-distortion amplified signal, with small back-off and improved electric power of the amplifier, since the phase adjusting unit shifts the phase of a main signal branched by the branching unit by a predetermined amount.

Moreover according to the present invention, the control mode varying unit can forcibly vary the control mode to the control mode of the first control unit when the monitoring unit detects a control abnormal state of the device, based on a signal from the distortion extracting loop circuit unit and the signal from the distortion removing loop circuit unit. Hence the present invention has the advantage of executing with high accuracy the feed-forward control under which the distortion of the main signal is extracted and removed, thus contributing to an improved reliability of the device.

Moreover, according to the present invention, the phase adjusting unit in the feed-forward amplifying device shifts the phase of a main signal branched by the branching unit by a predetermined amount so that the low-distortion amplified signal can be stably output, with small back-off of the amplifier and improved power efficiency. Hence the present invention has the advantage in that the intermodulation distortion component of a transmission signal can be suppressed when the feed-forward amplifying device is used at a base station amplifying, especially, multicarriers, so that interference between channels is removed and noise components of the transmission signal can be suppressed.

Figure 3:
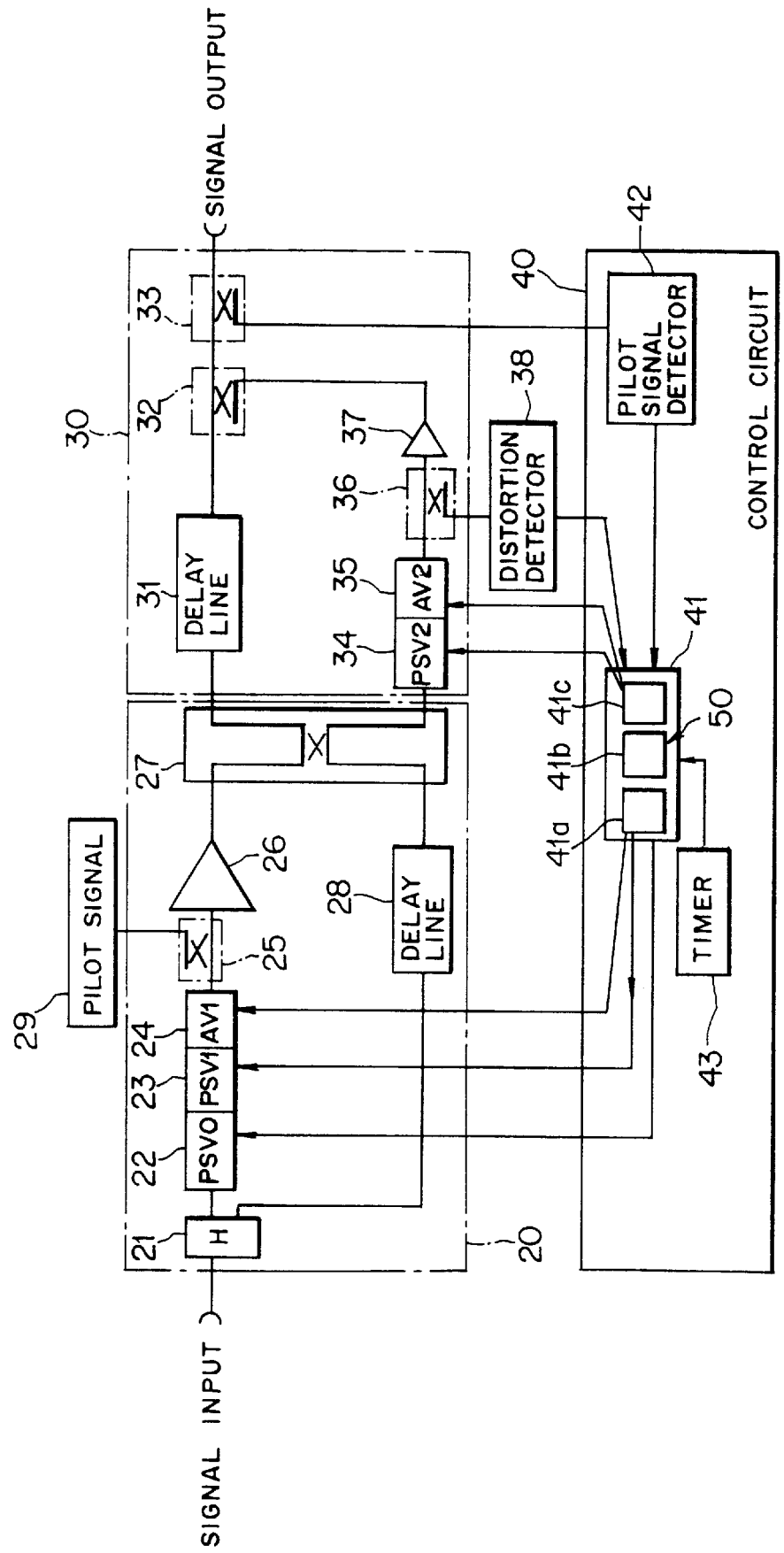
FIG. 3 is a block diagram illustrating a feed-forward amplifying device according to the first embodiment of the present invention.

(b) First Embodiment:

FIG. 3 is a block diagram illustrating a feed-forward amplifying device according to the first aspect of the present invention. The feed-forward amplifying device shown in FIG. 3 is applicable as the amplifying device in a base station accommodating plural mobile units in a radio communication system such as a digital automobile telephone system and can amplify the transmission signal in common to each mobile unit 209 as a multicarrier signal.

Referring to FIG. 3, numeral 26 represents a main amplifier. The main amplifier 26 amplifies the main signal as a multicarrier signal from the main signal system and a pilot signal supplied from the pilot signal producing unit 29 via the first coupler 25 and then produces the result as an amplified signal.

Numeral 20 represents a distortion extracting loop circuit unit. The distortion extracting loop circuit unit 20 supplies an amplified signal from the main amplifier 26 to the main signal system via the second coupler 27 connected to the rear stage of the main amplifier 26 and creates a main signal canceling signal with the same magnitude as that of the main signal in the main signal system and with the phase inverted to that of the main signal therein. The distortion extracting loop circuit unit 20 also extracts the distortion component of the main signal output from the main amplifier 26 using the main signal canceling signal.

The distortion extracting loop circuit unit 20 is formed of the branching unit 21, variable phase shifters 22 and 23, the variable attenuator 24 and the delay line 28, in addition to the first coupler 25, the second coupler 27 and the main amplifier 26.

The branching unit (H) 21 branches a signal input to the previous stage of the main amplifier 26 to which the main signal is input. The variable phase shifters (PSV0, PSV1) 22 and 23 vary the phase of the main signal from the branching unit 21 according to the control information from the control circuit 40 (to be described later). The variable attenuator 24 attenuates the main signal from the variable phase shifters 22 and 23, based on the control information from the control circuit 40.

Each of the variable phase shifter 23 and the variable attenuator 24 controls variably the phase and amplitude to create the main signal canceling signal which most cancels the main signal output from the main amplifier 26 by means of the second coupler 27. The variable phase shifter 22 shifts the phase variably controlled by the variable phase shifter 23 by a predetermined amount.

In other words, a combination of the variable phase shifter 23 and the variable attenuator 24 controls variably the phase and amplitude to convert a signal output from the second coupler 27 into a distortion extracting signal obtained by most canceling the main signal component. The variable phase shifter 23 and the variable attenuator 24 provide the first variable phase shifter and variable attenuator.

The delay line (first delaying unit) 28 delays another main signal branched by the branching unit 21 by a predetermined time and then outputs the result to the second coupler 27.

The second coupler (attenuator, first synthesizer) 27 attenuates a main signal amplified by the main amplifier 26 and a pilot signal supplied by the pilot signal generating unit 29 to the level before the signals are amplified, synthesizes the result with the main signal from the delay line 28, and outputs the synthesized result acting as a distortion extracting signal and the signal from the main amplifier 26 to the distortion removing loop circuit unit 30.

That is, the main signal is canceled by synthesizing a signal from the delay line 28 with a signal from the main amplifier 27 (inverted to the signal from the delay line 28) in the second coupler 27. As a result, the distortion component produced in the main amplifier 26 and the pilot signal can be extracted as a distortion extracting signal.

Numeral 30 represents a distortion removing loop circuit unit. The distortion removing loop circuit unit 30 which is arranged at the rear stage of the main amplifier 26 obtains a distortion extracting signal as a signal obtained by canceling the main signal component of an output of the main amplifier 26 and outputs the main signal component extracted from a signal in the main signal system at the rear stage of the main amplifier 26. The distortion removing loop circuit unit 30 consists of the delay line 31, the third coupler 32, the fourth coupler 33, the variable phase shifter 34, the variable attenuator 35, the fifth coupler 36, and the auxiliary amplifier 37.

The delay line (second delaying unit) 31 receives the main signal from the main amplifier 26, the distortion component produced by the main amplifier 26, and the pilot signal and delays them by a predetermined time.

The variable phase shifter 34 varies the phase of the distortion extracting signal from the second coupler 27 based on the control information from the control circuit 40. The variable attenuator 35 varies the amplitude of the distortion extracting signal from the second coupler 27 based on the control information from the control circuit 40. The variable phase shifter 34 and the variable attenuator 35 provide the second variable phase shifter and variable attenuator.

The fifth coupler 36 branches the distortion extracting signal obtained by variably controlling the phase an d amplitude output through the variable phase shifter 34 and the variable attenuator 35 and outputs it to the auxiliary amplifier 37 and the distortion detector 38.

The auxiliary amplifier 37 amplifies a distortion extracting signal component input from the variable phase shifter 34 and the variable attenuator 35 via the fifth coupler 36.

The third coupler (second synthesizing unit) 32 synthesizes the signal from the delay line 31 with the amplified signal from the auxiliary amplifier 37 and then outputs the main signal component. In other words, the third coupler 32 cancels component so other than the main signal component, including the distortion component produced in the main amplifier 26 and the pilot signal.

The fourth coupler 33 branches a signal input from the third coupler 32 and then outputs the signal as an output signal while it outputs the signal to the pilot signal detector 42 in the control circuit 40 (to be described later).

The distortion detector 38 detects (senses) the main signal component of a distortion extracting signal input from the variable phase shifter 34 and the variable attenuator 35 via the fifth coupler 36.

The control circuit 40 controls the distortion extracting loop circuit unit 20 and the distortion removing loop circuit unit 30. The control circuit 40 is formed of the CPU 41, the pilot signal detector 42, and the timer 43.

The pilot signal detector 42 receives an output signal via the fourth coupler 33 to detect (sense) the pilot signal component in the output signal.

The CPU 41 receives the main signal component detection information from the distortion detector 38 and pilot signal component detection information from the pilot signal detector 42. The CPU 41 includes a first control unit 41*a* which sets the control amount to the variable phase shifter 23 and the variable attenuator 24, a phase control unit 41*b* which sets the control amount of the variable phase shifter 22, and a second control unit 41*c* which sets the control amount of the variable phase shifter 34 and the variable attenuator 35, according to the main signal component detection information and the pilot signal component detection information.

In concrete, the first control unit 41*a* sets the control amount to the variable phase shifter 23 and the variable attenuator 24 to minimize the voltage of the main signal component detected by the distortion detector 38 at a set balanced point. The phase control unit 41*b* sets the control amount to the variable phase shifter 22 after a setting operation. The phase control unit 41*b* and the variable phase shifter 22 provide the phase adjusting unit 50.

The second control unit 41*c* sets the control amount to the variable phase shifter 34 and the variable attenuator 35 to minimize the detection voltage of the pilot signal detector 42 at a set balanced point for a fixed time corresponding to the timer count value of the timer 43.

That is, as shown in the AM-PM characteristic of the main amplifier 26, the first control unit 41*a* sets the control amount to the variable phase shifter 23 and the variable attenuator 24 to the value to which the voltage of the main signal component detected by the distortion detector 38 is minimized at the time the signal input to the main amplifier 26 has the average input power Pa of the multicarrier signal input to the main amplifier 26 (or at the balanced point).

Figure 4:
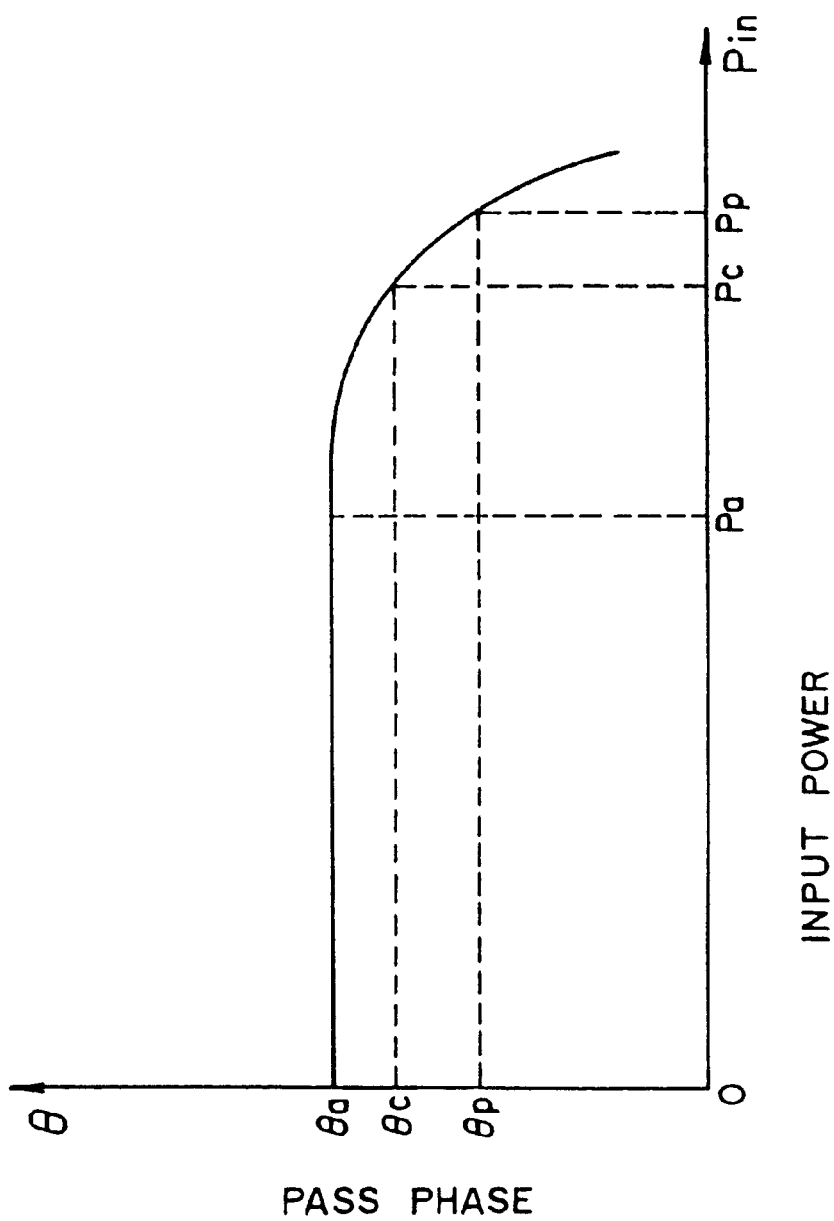
FIG. 4 is a diagram used for explaining the operation of the feed-forward amplifying device according to the first embodiment of the present invention.

Referring to FIG. 4, θa is a phase rotation of the main amplifier 26 at the time the multicarrier signal input to the main amplifier 26 has an average input power of Pa and θp is a phase rotation of the main amplifier 26 at the time the multicarrier signal input to the main amplifier 26 is at a peak level Pp.

After the phase control unit 41*b* has set the control amount of the variable phase shifter 23, the control amount of the variable phase shifter 22 is set to minimize the voltage of the main signal component detected by the distortion detector 38 when the level of a signal input to the main amplifier 26 is Pc as shown in FIG. 4 (or the phase rotation of the main amplifier 26 is θc).

In other words, in the point where the variable phase shifter 22 balances the phase control amount of the multicarrir signal input to the main amplifier 26 being the phase rotation θc shifted from the balanced point θa of the phase rotation to the average input power by a predetermined amount, when a multicarrier signal (signal Pc) which rotates the phase θc is input, the voltage of the main signal component detected by the distortion detector 38 can be minimized.

Figure 5:
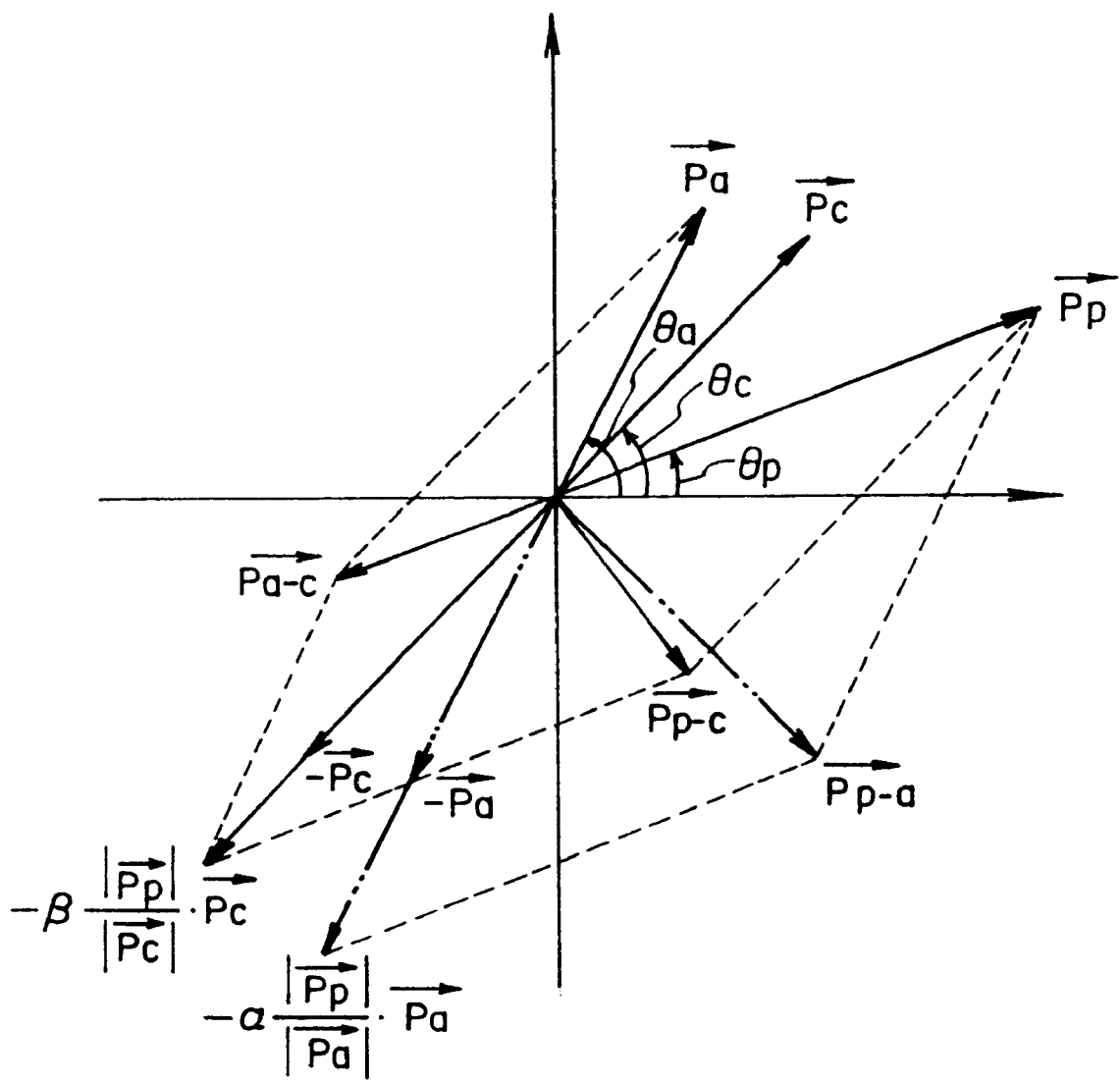
FIG. 5 is a vector diagram used for explaining the operation of the feed-forward amplifying device according to the first embodiment of the present invention.

The distortion extracting loop circuit unit 20 shifts the phase at the balanced point by (θa–θc). For this reason, when the level of the signal input to the main amplifier 26 is Pa and the phase rotation of the main amplifier 26 is θa, the distortion detector 38 detects the residual component of the main signal as the vector Pa–c shown in FIG. 5 so that the distortion extracting signal is deteriorated.

Hence the input level of the auxiliary amplifier 37 is increased because the distortion extracting signal accompanying the shift in phase at the balanced point deteriorates. However, since the third coupler 32 in the distortion removing loop circuit unit 30 can cancel the degraded amount, the feed-forward amplifying device guarantees producing the output of which the distortion component is sufficiently suppressed.

When the main signal of a peak level Pp is input to the main amplifier 26, the phase rotation is θp. The phase rotation (θc–θp) from the balanced point can be adjusted to a value smaller than the phase rotation (θa–θp) from the balanced point where no phase control amount is shifted. Hence the distortion detector 38 detects the main signal as the main signal residual component as the vector Pp–c [=vector Pp–β(Pp/Pc) vector Pc] (where β is a coefficient showing the AM—AM characteristic of the main amplifier) shown in FIG. 5. Hence shifting a phase control amount results in a small main signal residual component, compared with no shifting case (refer to the vector Pp–a shown in FIG. 5).

The phase rotation θc is set along the range where the capability of suppressing the distortion component of an output signal from the feed-forward amplifying device is not remarkably decreased because of the non-linearity of the auxiliary amplifier 37.

Figure 6:
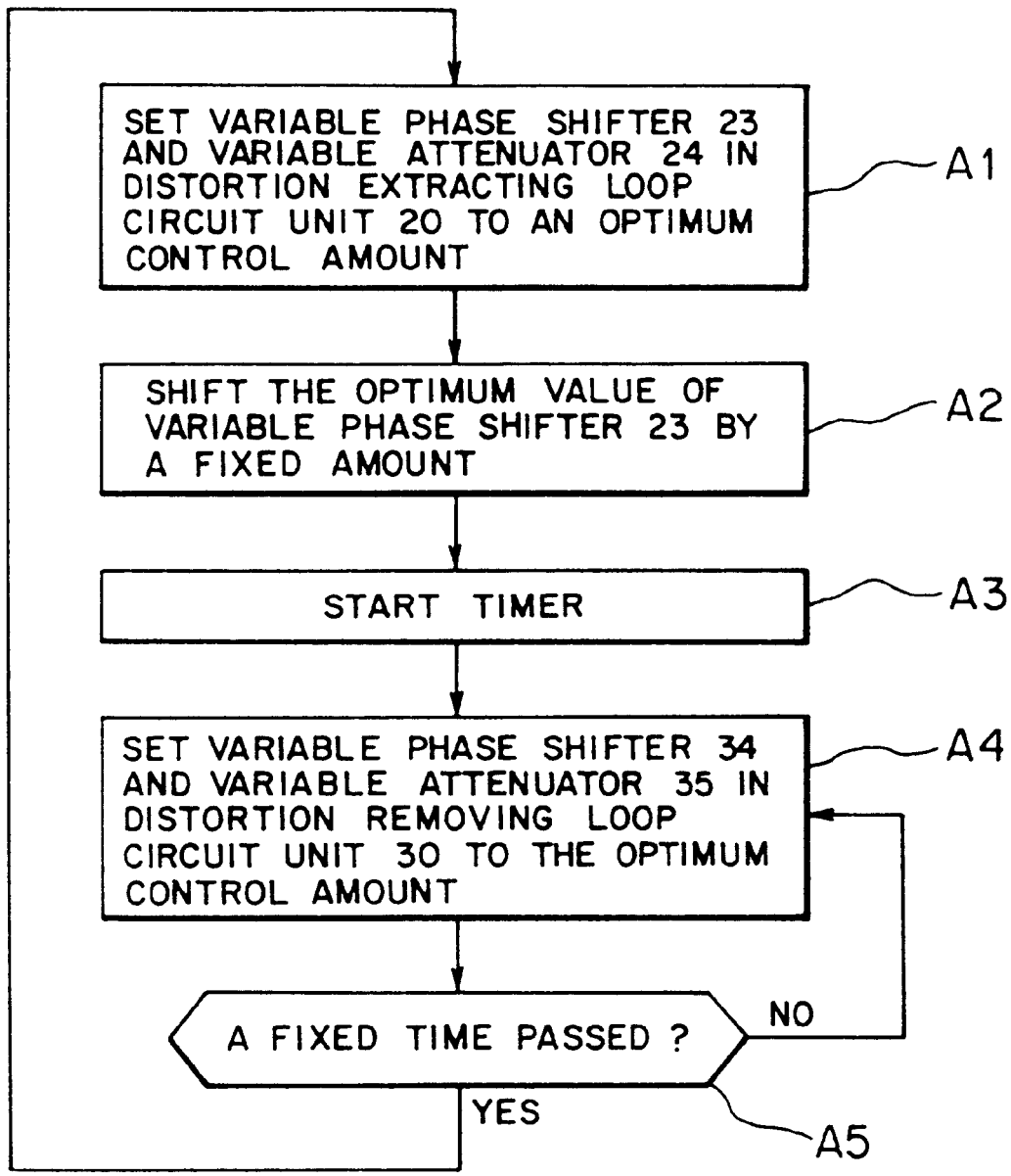
FIG. 6 is a flowchart used for explaining the feed-forward amplifying device according to the first embodiment of the present invention.

The operation of the feed-forward amplifying device with the above-mentioned configuration according to the first embodiment of the present invention will be described below in detail using the flowchart shown in FIG. 6.

When a multicarrier signal is input as a main signal to the feed-forward amplifying device, a combination of the variable phase shifter 23 and the variable attenuator 24 in the distortion extracting loop circuit unit 20 sets the control amount under control of the first control unit 41*a* to minimize the voltage of the main signal component detected by the distortion detector 38 at the balanced point where the input multicarrier signal has an average input power Pa (step A1).

When a control amount is set to the variable phase shifter 23 and the variable attenuator 24, the phase control unit 41b sets the control amount to the variable phase shifter 22 (step A2). The control amount, at which the voltage of the main signal component detected by the distortion detector 38 is minimized, is set to the variable phase shifter 22 when the main amplifier 26 receives the signal level of Pc shown in FIG. 4 (and has the phase rotation of θc). Thus, the distortion extracting loop circuit unit 20 can produce an amplification signal and a distrotion extracting signal.

When the control amount is set to the variable phase shifter 22, the timer 43 is activated (step A3). Till a predetermined time passes corresponding to the timer count value of the timer 43, the second control unit 41c sets a control amount to the variable phase shifter 34 and the variable attenuator 35 to minimize the detection voltage of the pilot signal detector 42 at a balanced point (the closed loop formed of the step A4 and No route in step A5).

Where the main signal of the peak level Pp is input to the main amplifier 26, the phase rotation is θp. However, the phase rotation (θc–θp) from the balanced point can be set to a value smaller than the phase rotation (θa–θp) from the balanced point with no phase control amount shifted. The distortion detector 38 detects the rotation as the residual component of a main signal shown with the vector Pp–c shown in FIG. 5. The detected component is smaller than the residual component of the main signal with no phase control amount shifted (refer to the vector Pp–a).

Since shifting the phase control amount leads to decreasing the main signal component detected by the distortion detector 38, the distortion component can be decreased when the third coupler 32 cancels the components other than the main signal. The distortion extracting loop circuit unit 30 can output the main signal as an amplified signal in which the distortion is effectively removed.

When a predetermined time passes corresponding to the timer count value of the timer 43 after setting the control amount of the variable phase shifter 22, each set value is reset. Then the control amount to the variable phase shifter 23 and the variable attenuator 24 in the distortion extracting loop circuit unit 20 is reset (from YES route in step A5 to step A1).

Thereafter, the steps A2 to A5 are repeated like the above case. The CPU 41 can repeat sequentially control of the variable phase shifter 23 and the variable attenuator 24 in the distortion extracting loop circuit unit 20, control of the variable phase shifter 22, and control of the variable phase shifter 34 and the variable attenuator 35.

The feed-forward amplifying device according to the first embodiment of the present invention has the advantage of improving the power efficiency with a small back-off of the amplifier and of stably outputting a low-distortion amplified signal since the phase adjusting unit 50 shifts the phase of a main signal branched in the branching unit 21 by a predetermined amount.

Figure 7:
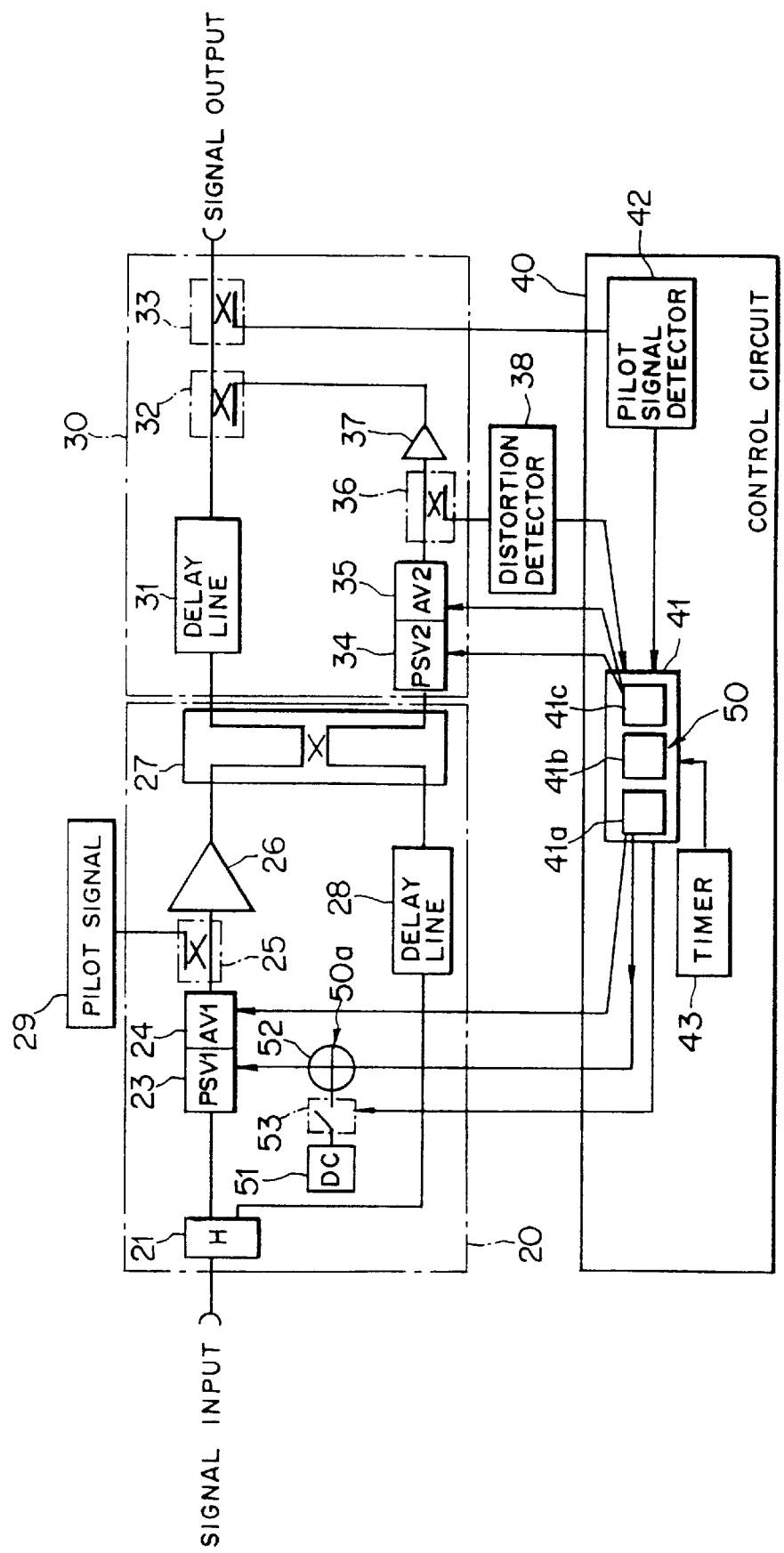
FIG. 7 is a block diagram illustrating the feed-forward amplifying device according to the first modified example of the first embodiment of the present invention.

(b1) First Modified Example of First Embodiment:

FIG. 7 is a block diagram illustrating a feed-forward amplifying device according to the first modification of the first embodiment according to the present invention. Like the first embodiment, the feed-forward amplifying device shown in FIG. 7 amplifies a multicarrier signal sent from the main signal system.

The feed-forward amplifying device according to this modification differs from the first embodiment in that the phase adjusting unit 50a which shifts the phase of a main signal branched in the branching unit 21 by a predetermined amount is formed of the phase control unit 41b, the dc power source 51, the adder 52, the switch 53, and the variable phase shifter 23. The other constituent elements are basically similar to those in the first embodiment.

The first control unit 41a sets a control amount to the variable phase shifter 23 and the variable attenuator 24, and then the phase control unit 41b outputs a control signal to shift the control amount of the variable phase shifter 23 by a predetermined amount.

The dc power source (phase information setting unit) 51 sets phase information on shifting the phase of a main signal by a predetermined amount in the form of an analog voltage due to the electromotive force generated. The adder 52 adds the phase information set by the dc power source 51 to the phase control amount by the first control unit 41a in the form of an analog voltage to output the result to the variable phase shifter 23.

The switch 53 arranged between the dc power source 51 and the adder 52 performs a switching operation by turning on when the phase of the main signal is shifted by a predetermined amount according to the control signal from the phase control unit 41b and turning off in other operations.

The feed-forward amplifying device having the above-mentioned configuration according to the first modification of the first embodiment of the present invention operates basically similarly to that in the first embodiment, except that the control amount of the variable phase shifter 23 is shifted by a predetermined amount after the control amount of the first control unit 41a has been set.

When the variable phase shifter 23 shifts the control amount by a predetermined amount after the control amount setting operation by means of the first control unit 41a, the phase control unit 41b produces a control signal to switch on the switch 53.

Thus the dc power source 51 and the adder 52 are activated electrically. The adder 52 adds an analog voltage corresponding to the control amount from the dc power source 51 to the control amount (analog voltage signal) corresponding to the balanced point where the multicarrier signal has an average input power Pa, thus shifting the control amount of the variable phase shifter 23 by a predetermined amount. Hence the variable phase shifter 23 can shift the phase of the main signal by a predetermined amount.

For example, the balanced point where the variable phase shifter 23 controls the phase control amount of the multicarrier signal input to the main amplifier 26 corresponds to the phase rotation θc which is shifted from the balanced point θa of the phase rotation to the average input power of the multicarier signal by a predetermined amount. When the multicarrier signal (signal level Pc) which causes the phase rotation θc is input, the voltage of the main signal component detected by the distortion detector 38 can be minimized.

When the main amplifier 26 receives a main signal of a peak level Pp, the phase rotation is θp. The phase rotation (θc–θp) from the balanced point can be set to be smaller than the phase rotation (θa–θp) from the balanced point where no phase control amount is shifted.

Since the phase control amount shifted can be adjusted to be smaller than the main signal component detected by the distortion detector 38, the distortion component is small even when the third coupler 32 cancels components other than the main signal. The distortion extracting loop circuit unit 30 can output the main signal acting as an amplified signal of which the distortion is effectively removed.

As described above, the feed-forward amplifying device according to the first modification of the first embodiment of the present invention has the advantage of outputting stably a low-distortion amplified signal, with the improved power efficiency due to a small back-off of the amplifier, since the phase adjusting unit 50*a* shifts the phase of a main signal branched by the branching unit 21 by a predetermined amount.

Figure 8:
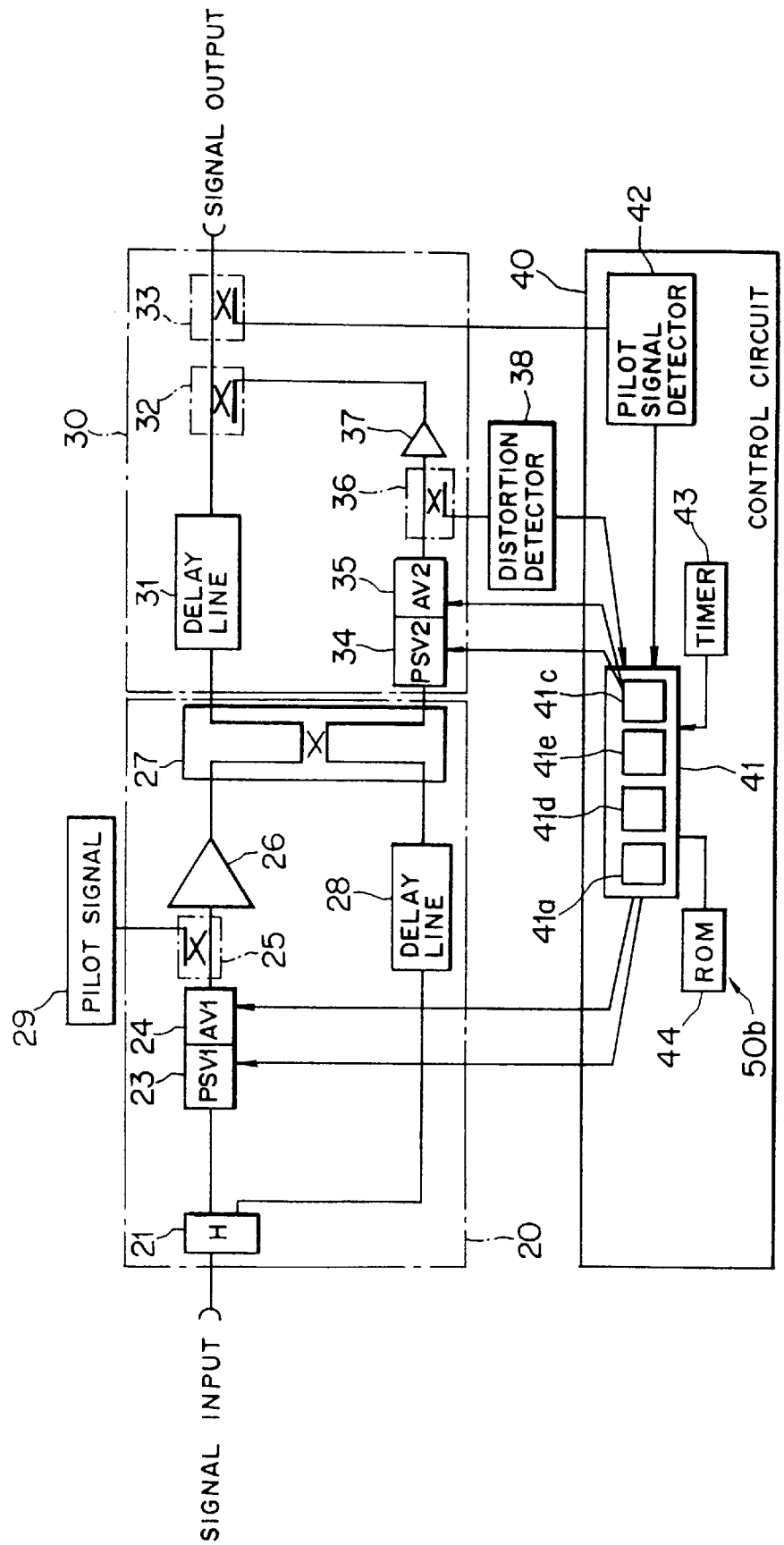
FIG. 8 is a block diagram illustrating the feed-forward amplifying device according to the second modified example of the first embodiment of the present invention.

(b2) Second Modified Example of First Embodiment:

FIG. 8 is a block diagram illustrating the feed-forward amplifying device according to the second modification of the first embodiment of the present invention. Like the first embodiment, the feed-forward amplifying device shown in FIG. 8 amplifies the multicarrier signal from the main signal system.

The feed-forward amplifying device according to this modification differs from the first embodiment in that the phase adjusting unit 50*b* is formed of the ROM 44, the phase information adder 41*d*, the phase adjusting and controlling unit 41*e*, and the variable phase shifter 23. The other constituent elements are basically similarly to the first embodiment.

The ROM (phase information storing unit) 44 stores phase information to shift the phase of the main signal by the predetermined amount.

The phase information adder 41*d* receives information on the phase of a main signal to be shifted output from the ROM 44 and adds the phase information to the phase control amount to the variable phase shifter 23 in the first control unit 41*a*. The phase information adder 41*d* is formed of, for example, software.

The phase adjusting and controlling unit 41*e* sets the control amount of the variable phase shifter 23 to minimize the voltage of the main signal component detected by the distortion detector 38 at the set balanced point and produces a control signal to the variable phase shifter 23, according to the phase information added by the phase information adder 41*d*, when the variable phase shifter 23 shifts the control amount by a predetermined amount, thus shifting the phase of the main signal by a predetermined amount.

The feed-forward amplifying device having the above-mentioned configuration according to the second modification of the first embodiment of the present invention operates basically like the first embodiment, except that the control amount of the variable phase shifter 23 is shifted after setting the control amount by the first control unit 41*a*.

When the first control unit 41*a* sets a control amount to the variable phase shifter 23 and the variable attenuator 24, the phase information adder 41*d* reads information on the phase of a main signal to be shifted from the ROM 44 and then adds logically the information to the phase control amount to the variable phase shifter 23 by the first control unit 41*a*.

The phase adjusting and controlling unit 41*e* outputs a control signal including phase information to be varied to the variable phase shifter 23, based on the phase information added by the phase information adder 41*d*. Thus the variable phase shifter 23 can shift the phase of the main signal by a predetermined amount according to the control signal from the phase adjusting and controlling unit 41*e*.

For example, the balanced point where the variable phase shifter 23 controls the phase of the multicarrier signal input to the main amplifier 26 is the time the phase rotation θc is shifted from the balanced point θa of the phase rotation to the average input power of the multicarrier signal by a predetermined amount. When the multicarrier signal (signal level Pc) which causes the phase rotation θc is input, the voltage of the main signal component detected by the distortion detector 38 can be minimized.

When the main amplifier 26 receives a main signal of a peak level Pp, the phase rotation is θp. The phase rotation (θc–θp) from the balanced point can be set to be smaller than the phase rotation (θa–θp) from the balanced point where no phase control amount is shifted.

Since the phase control amount shifted can be adjusted to be smaller than the main signal component detected by the distortion detector 38, the distortion component is small even when the third coupler 32 cancels components other than the main signal. The distortion extracting loop circuit unit 30 can output the main signal acting as an amplified signal of which the distortion is effectively removed.

As described above, the feed-forward amplifying device according to the second modification of the first embodiment of the present invention has the advantage of outputting stably a low-distortion amplified signal, with the improved power efficiency due to a small back-off of the amplifier, since the phase adjusting unit 50*b* shifts the phase of a main signal branched by the branching unit 21 by a predetermined amount.

Figure 9:
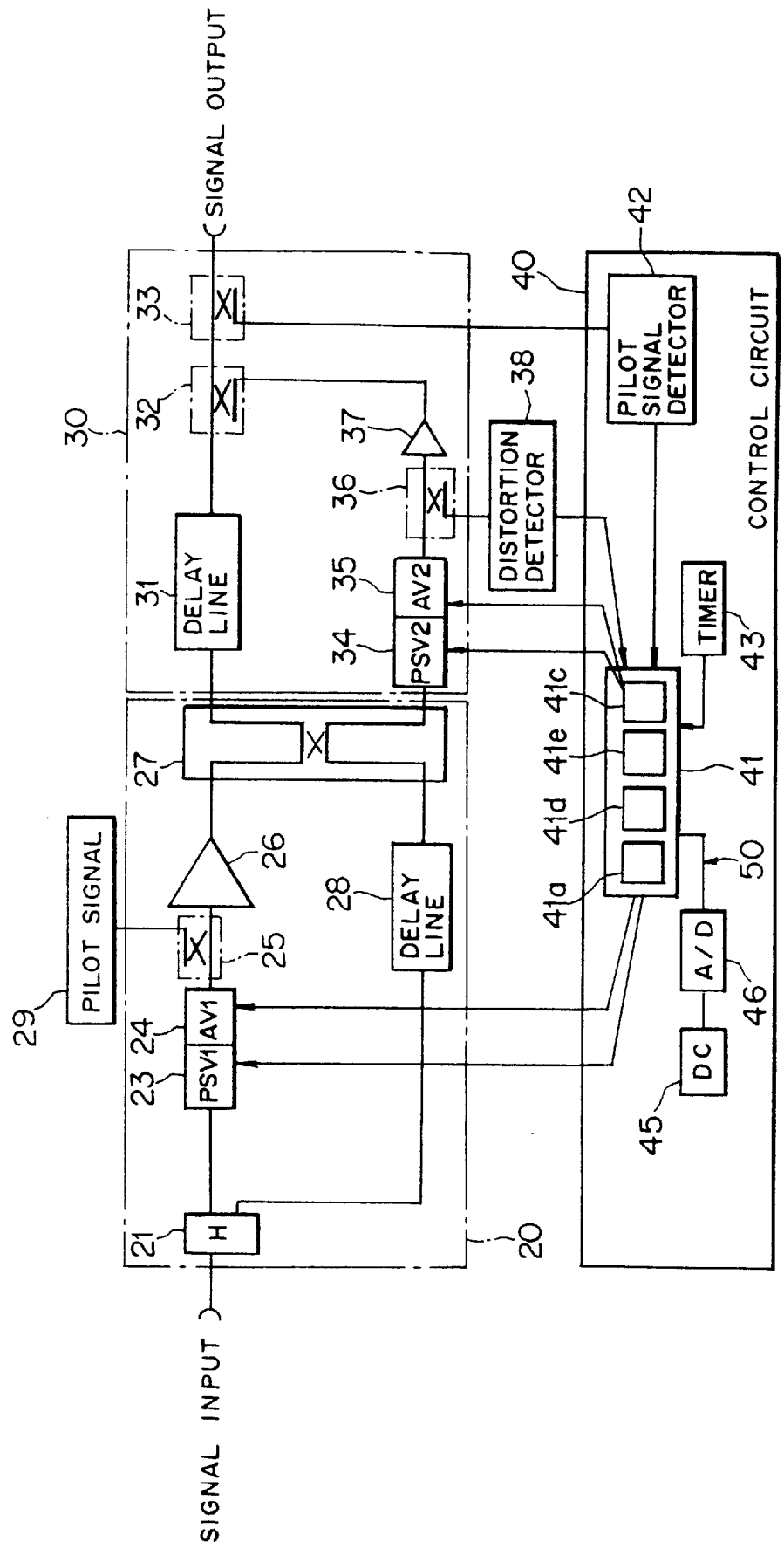
FIG. 9 is a block diagram illustrating the feed-forward amplifying device according to the third modified example of the first embodiment of the present invention.

(b3) Third Modified Example of First Embodiment:

FIG. 9 is a block diagram illustrating the feed-forward amplifying device according to the third modification of the first embodiment of the present invention. Like the first embodiment, the feed-forward amplifying device shown in FIG. 9 amplifies the multicarrier signal from the main signal system.

The feed-forward amplifying device according to this modification differs from the first embodiment in that the phase adjusting unit 50*c* is formed of the dc current 45, the A/D converter 46, the phase information adder 41*d*, the phase adjusting and controlling unit 41*e*, and the variable phase shifter 23. The other constituent elements are basically similarly to the first embodiment.

The dc power source (phase information setting unit) 45 sets phase information on shifting the phase of the main signal by the predetermined amount in the form of an analog voltage according to an electromotive force generated. The A/D converter 46 A/D-converts an analog voltage value set by the dc power source 45.

The phase information adder 41*d* receives information on the phase of a main signal converted by the A/D converter 46 and adds the phase information to the phase control amount to the variable phase shifter 23 in the first control unit 41*a*. The phase information adder 41*d* is formed of, for example, software.

The phase adjusting and controlling unit 41*e* sets the control amount of the variable phase shifter 23 to minimize the voltage of the main signal component detected by the distortion detector 38 at the set balanced point and produces a control signal to the variable phase shifter 23, according to the phase information added by the phase information adder 41*d*, when the variable phase shifter 23 shifts the control amount by a predetermined amount, thus shifting the phase of the main signal by a predetermined amount.

The feed-forward amplifying device having the above-mentioned configuration according to the third modification of the first embodiment of the present invention operates basically like the first embodiment, except that the control amount of the variable phase shifter 23 is shifted after setting the control amount by the first control unit 41*a*.

When the first control unit 41*a* sets a conrol amount to the variable phase shifter 23 and the variable attenuator 24, the phase information adder 41*d* reads information on the phase of a main signal to be shifted from the A/D converter 46 and then adds logically the information to the phase control amount to the variable phase shifter 23 by means of the first control unit 41a.

The phase adjusting and controlling unit 41e outputs a control signal including phase information to be varied to the variable phase shifter 23, based on the phase information added by the phase information adder 41d. Thus the variable phase shifter 23 can shift the phase of the main signal by a predetermined amount according to the control signal from the phase adjusting and controlling unit 41e.

For example, the balanced point where the variable phase shifter 23 controls the phase of the multicarrier signal input to the main amplifier 26 corresponds to the time the phase rotation θc is shifted from the balanced point θa of the phase rotation to the average input power of the multicarrier signal by a predetermined amount. When the multicarrier signal (signal level Pc) which causes the phase rotation θc is input, the voltage of the main signal component detected by the distortion detector 38 can be minimized.

When the main amplifier 26 receives a main signal of a peak level Pp, the phase rotation is θp. The phase rotation (θc–θp) from the balanced point can be set to be smaller than the phase rotation (θa–θp) from the balanced point where no phase control amount is shifted.

Since the phase control amount shifted can be adjusted to be smaller than the main signal component detected by the distortion detector 38, the distortion component is small even when the third coupler 32 cancels components other than the main signal. The distortion extracting loop circuit unit 30 can output the main signal acting as an amplified signal of which the distortion is effectively removed.

As described above, the feed-forward amplifying device according to the third modification of the first embodiment of the present invention has the advantage of outputting stably a low-distortion amplified signal, with the improved power efficiency due to a small back-off of the amplifier, since the phase adjusting unit 50c shifts the phase of a main signal branched by the branching unit 21 by a predetermined amount.

Figure 10:
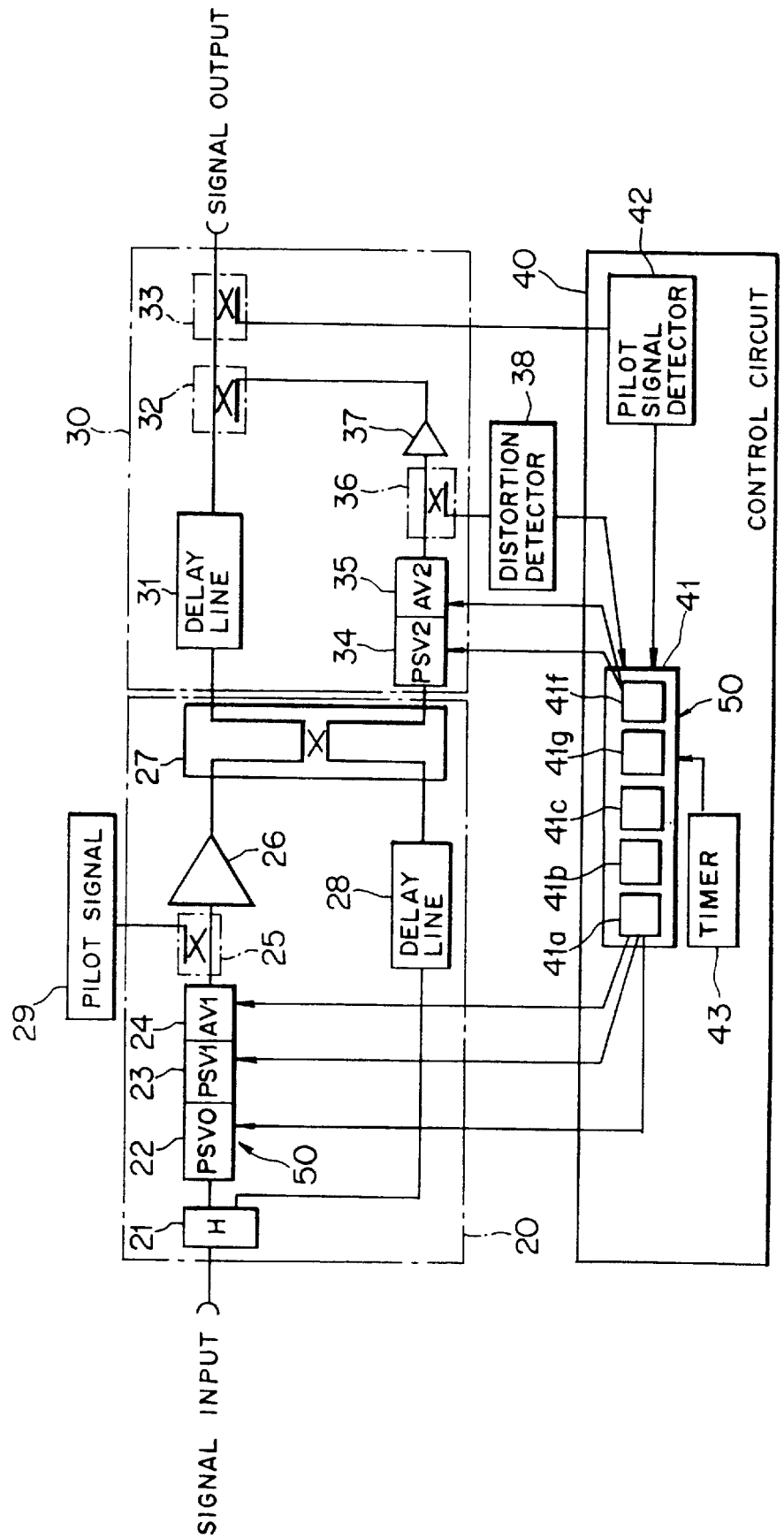
FIG. 10 is a block diagram illustrating a feed-forward amplifying device according to the second embodiment of the present invention.

(c) Second Embodiment:

FIG. 10 is a block diagram illustrating the feed-forward amplifying device according to the second embodiment of the present invention. Like the first embodiment, the feed-forward amplifying device shown in FIG. 10 amplifies the multicarrier signal from the main signal system.

The feed-forward amplifying device according to this modification differs from the first embodiment in that the CPU 41 includes the monitoring unit 41f and the control mode varying unit 41g. The other constituent elements are basically similar to those in the first embodiment.

The monitoring unit 41f receives the main signal detecting signal from the distortion detector 38 as a signal sent from the distortion extracting loop circuit unit 20 and a detecting signal detecting the pilot signal detector 42 as a signal sent from the distortion removing loop circuit unit 30 and then monitors a control abnormality and the level of a signal uncanceled by the distortion removing loop circuit unit 30.

If the monitoring unit 41f detects the abnormal device state such as an abnormal control state, the control mode varying unit 41g varies forcibly the control mode of the first control unit 41a even when the phase control unit 41b and the second control unit 41c are in a control operation.

If the monitoring unit 41f detects an abnormal state, the feed-forward amplifying device having the above-mentioned configuration according to the second embodiment of the present invention operates basically similarly to that in the first embodiment, except that the control mode varying unit 41g varies forcibly the control mode of the first control unit 41a.

Figure 11:
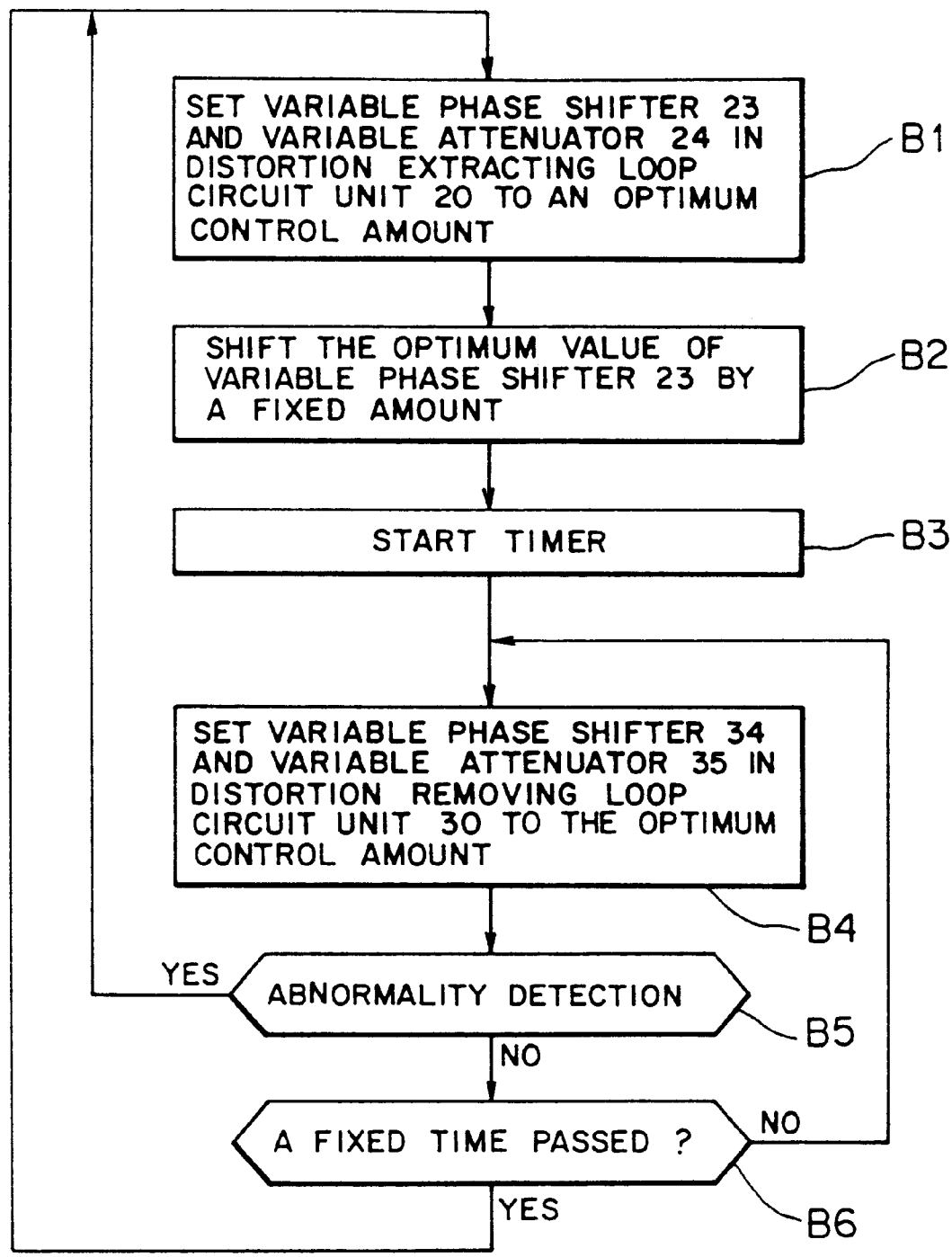
FIG. 11 is a flowchart used for explaining the feed-forward amplifying device according to the second embodiment of the present invention.
Figure 13:
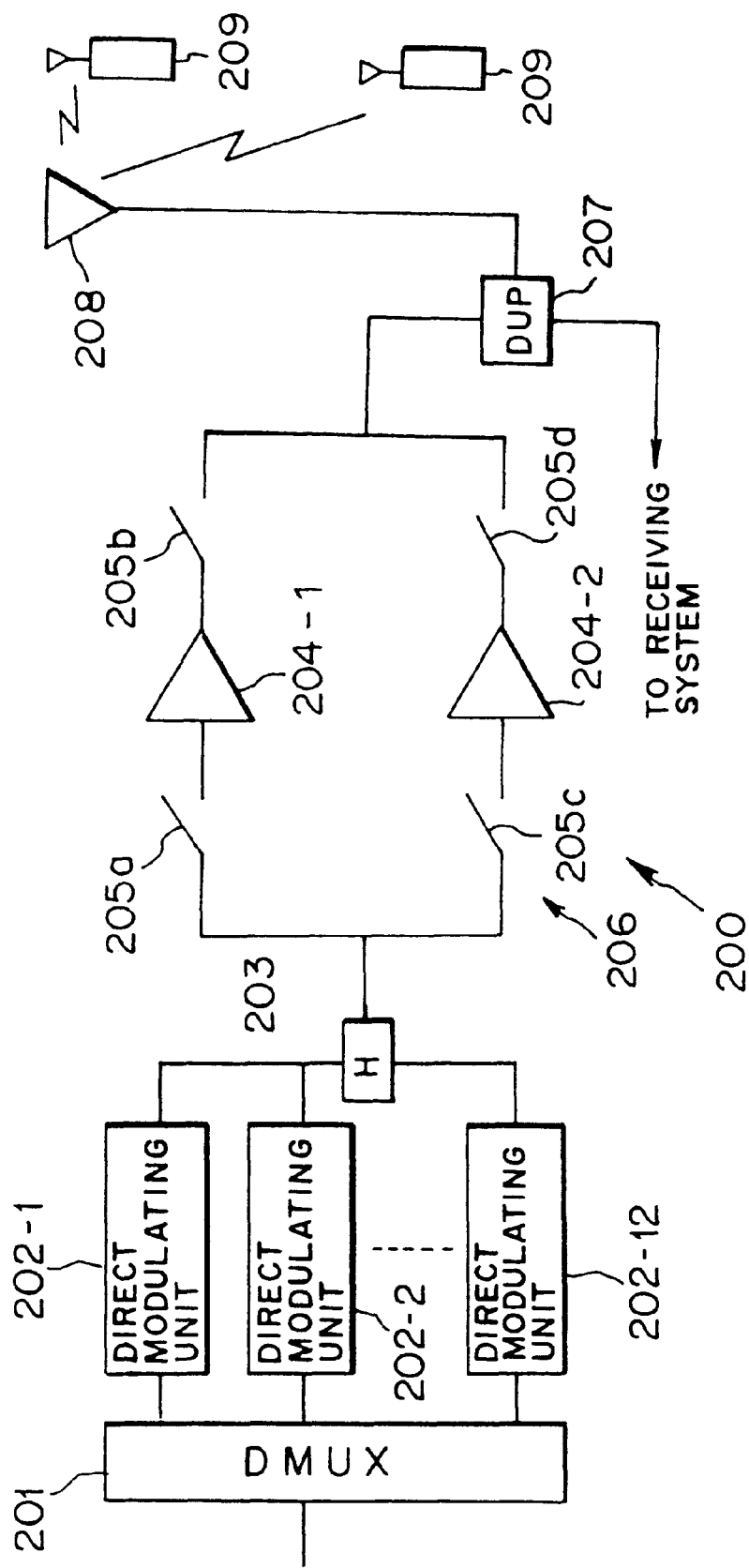
FIG. 13 is a block diagram illustrating the configuration of a transmitter installed at a base station.
Figure 14:
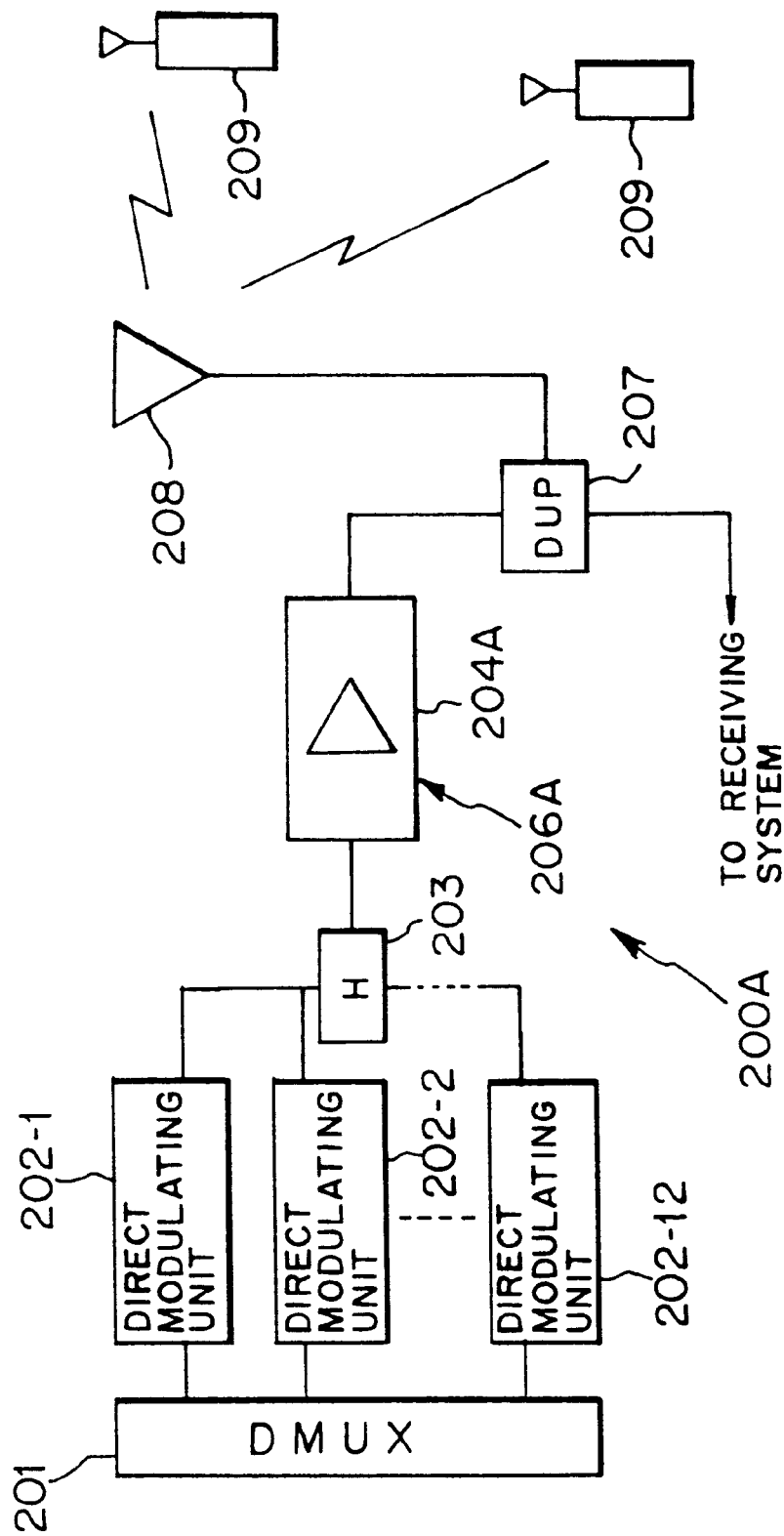
FIG. 14 is a block diagram illustrating the configuration of a transmitter installed at a base station.
Figure 15:
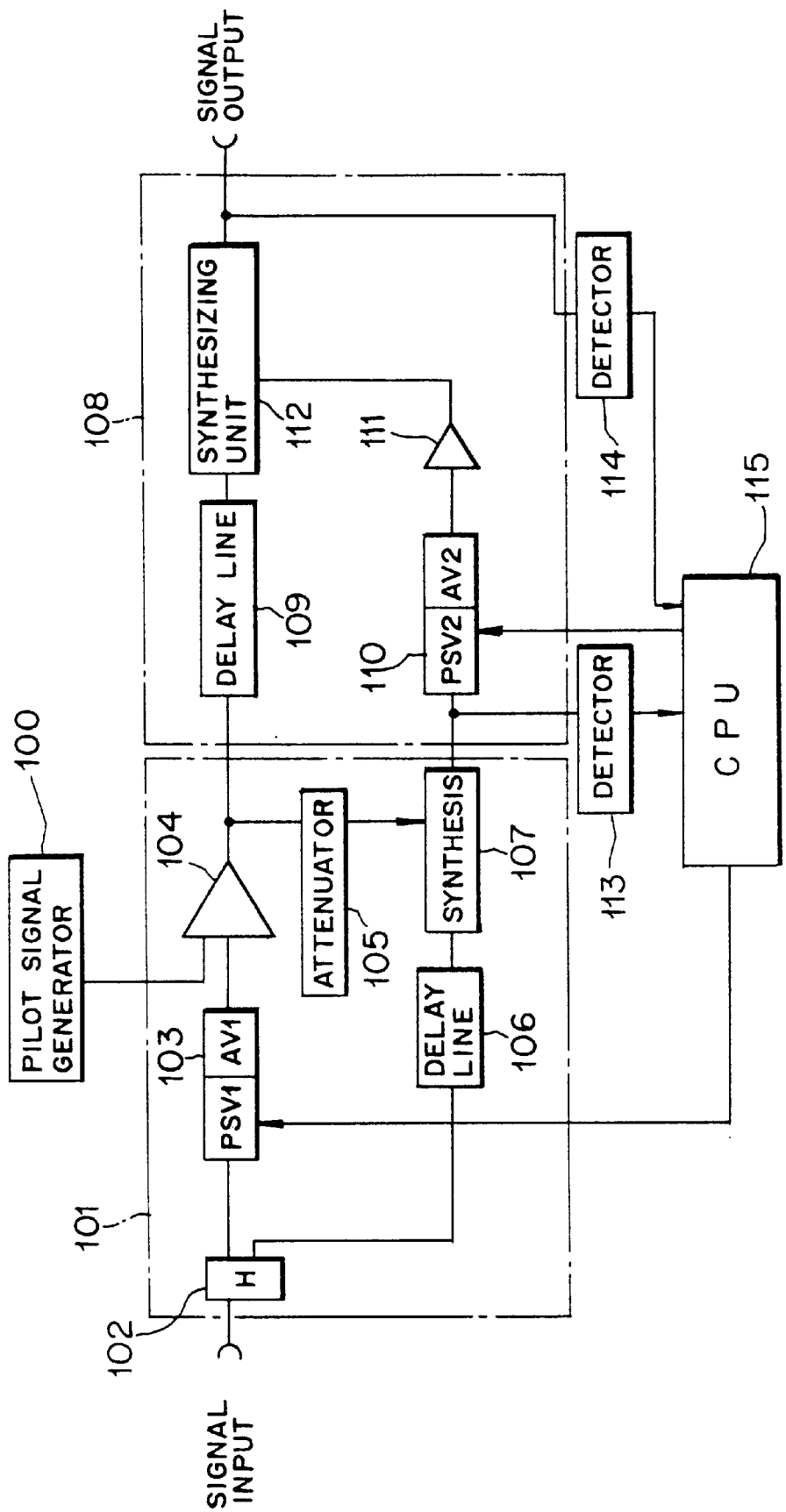
FIG. 15 is a block diagram illustrating a general feed-forward amplifying device.
Figure 16:
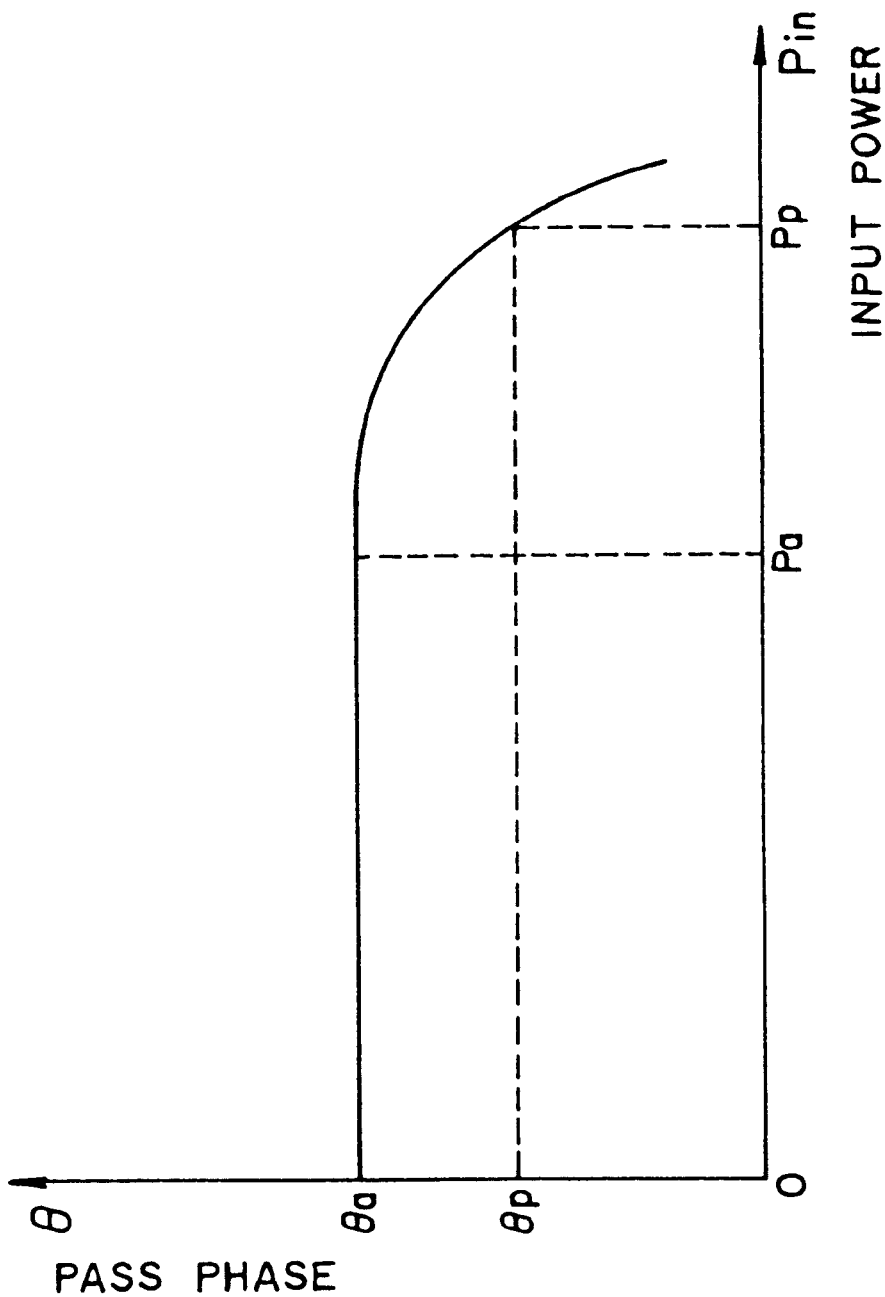
FIG. 16 is a diagram showing an example of the AM-PM characteristic of a general amplifier.

As shown with the flowchart in FIG. 11, when the feed-forward amplifying device receives a multicarrier signal acting as a main signal, the combination of the variable phase shifter 23 and the variable attenuator 24 in the distortion extracting loop circuit unit 20 sets the control amount to minimize the voltage of the main signal component detected by the distortion detector 38, under control of the first control unit 41a, with the balanced point where the input multicarrier signal has an average input power Pa (step B1).

When the control amount to the variable phase shifter 23 and the variable attenuator 24 is set, the phase control unit 41b sets a control amount to the variable phase shifter 22 (step B2). When the level of the signal input to the main amplifier 26 is Pc as shown in FIG. 4 (and has the phase rotation θc), the control amount to the variable phase shifter 22 is set to minimize the voltage of the main signal component detected by the distortion detector 38. Thus the distortion extracting loop circuit unit 20 can output an amplified signal and a distortion extracting signal.

When the control amount is set to the variable phase shifter 22, the timer 43 is activated (step B3). Till a predetermined time passes based on the timer count value of the timer 43, the second control unit 41c sets a control amount to the variable phase shifter 34 and the variable attenuator 35 to minimize the voltage detected by the pilot signal detector 42 at a balanced point (step B4).

When the main signal of a peak level of Pp is input to the main amplifier 26, the phase rotation is θp. However, the phase rotation from the balanced point can be set to (θc–θp) smaller than the phase rotation (θa–θp) from the balanced point where no phase control amount is shifted.

Shifting the phase control amount allows the main signal component detected by the distortion detector 38 to be decreased to a small value. Hence when the third coupler 32 cancels the components except the main signal, the distortion component is reduced. The distortion extracting loop circuit unit 30 can output the main signal as an amplified signal in which the distortion is effectively removed.

The monitoring unit 41f monitors the control abnormality and the level of a signal which is not canceled by the control abnormality and distortion removing loop circuit unit 30, according to the main signal detecting signal from the distortion detector 38 and the pilot signal detecting signal from the pilot signal detector 42. If a device failure such as abnormal control is detected, the monitoring unit 41f varies forcibly the first control unit 41a to the control mode as an initial control mode even when the phase control unit 41b and the second control unit 41c are in operation (step B5 to step B1 via YES route).

When a predetermined time has passed without detecting any abnormal state occurrence (from step B5 to step B6 via NO route) after setting the control amount to the variable phase shifter 22 based on the timer count value of the timer 43, the above-mentioned set value is reset. Thus the control amount to each of the variable phase shifter 23 and the variable attenuator 24 in the distortion extracting loop circuit unit 20 is reset (from step B6 to step B1 via YES route).

Thereafter, the steps B1 to B6 are repeated similarly to the above-mentioned manner. The CPU 41 can control repeatedly and sequentially the variable phase shifter 23, the variable attenuator 24, the variable phase shifter 22, the variable phase shifter 34, and the variable attenuator 35 in the distortion extracting loop circuit unit 20.

As described above, like the first embodiment, the feed-forward amplifying device according to the second embodiment of the present invention has the advantage of outputting stably a low-distortion amplified signal, with the power efficiency increased due to a small back-off of the amplifier, when the phase adjusting unit 50 shifts the phase of a main signal branched by the branching unit 21 by a predetermined amount.

When the monitoring unit 41f detects a failure device such as an abnormal control, based on the distortion extracting signal from the distortion extracting loop circuit unit 20 and the signal from the distortion removing loop circuit unit 30, the control mode varying unit 41g can vary its control mode to the control mode of the first control unit 41a. This feature therefore contributes to performing the feed-forward control under which the distortion of the main signal is extracted and removed with high accuracy so that the reliability of the device can be improved.

In the above-mentioned embodiment, the monitoring unit 41f and the control mode varying unit 41g are applied to the feed-forward amplifying device according to the first embodiment. This invention however should not be limited only to the above-mentioned embodiment. For example, the monitoring unit 41f and the control mode varying unit 41g may be applied to the feed-forward amplifying device according to each modification of the present embodiment. Such a configuration can enjoy the same advantage as that in each modification.

What is claimed is:

1. A feed-forward amplifying device for a main signal system, comprising:
   a distortion extracting loop circuit including a main amplifier for amplifying a main signal in the main signal system, said distortion extracting loop circuit being operable to produce a distortion extracting signal by controlling the phase of said main signal by canceling a main signal component of an output from said main amplifier; and
   a distortion removing loop circuit disposed at the rear stage of said main amplifier for outputting only said main signal component of the main signal in the main signal system at the rear stage of said main amplifier using said distortion extracting signal produced by canceling said main signal component;
   said distortion extracting loop circuit being operable to execute a phase control at an optimum control point disposed within a range between a maximum phase control point where said main signal component can be canceled to a maximum, and a peak point where said main signal component can be input at a peak level, said optimum phase control point being located at a position toward said maximum phase control point and far from said peak point.

2. A feed-forward amplifying device for a main signal system, comprising:
   a distortion extracting loop circuit including a main amplifier for amplifying a main signal in the main signal system,
   a branching unit for branching a main signal in the main signal system into first and second main signal components at the front stage of said main amplifier,
   a first-variable phase-shifter/attenuator for varying the phase and amplitude of said first main signal component, which is branched from said main signal by said branching unit, to output the resultant signal to said main amplifier,
   an attenuator for receiving said main signal amplified by said main amplifier and then attenuating the resultant signals to their respective original levels before being amplified by said main amplifier,
   a first delaying unit for delaying said second main signal component, which is branched from said main signal by said branching unit, by a first predetermined time, and a first synthesizing unit for synthesizing the attenuated signal from said attenuator with the delayed signal from said first delaying unit to cancel said first and second main signal components and to thereby produce the resultant signal as a distortion extracting signal;
   a distortion removing loop circuit including
      a second delaying unit for delaying said first main signal component, which is amplified by said main amplifier, by a second predetermined time,
      a second variable phase-shifter/attenuator for varying the phase and amplitude of said distortion extracting signal from said first synthesizing unit,
      an auxiliary amplifier for amplifying said distortion extracting signal from said second variable phase-shifter/attenuator with the same amplifying factor as that of said main amplifier, and
      a second synthesizing unit for synthesizing the delayed signal from said second delaying unit with the amplified signal from said auxiliary amplifier to cancel said distortion extracting signal and to thereby produce said main signal; a control circuit including:
         a first control unit for controlling said first variable phase shifter/attenuator to set the phase of said first main signal component, which is branched fron said main signal by said branching unit, to a maximum phase control point where said first and second main signal components can be canceled to a maximum, and
         a second control unit for controlling said second variable phase-shifter/attenuator after the control operation of said first control unit to cancel components other than the main signal component of said signal output from said second synthesizing unit so that only said main signal component is obtained; and
         a phase adjusting unit for shifting the phase of said first main signal component to an optimum phase control point disposed within a range between said maximum phase control point and a peak point where said first and second main signal components can be input at a peak level, said optimum control point being located at a position toward said maximum phase control point and far away from said peak point.

3. The feed-forward amplifying device according to claim 2, wherein said second control unit is operable to execute a control operation for a fixed time after said phase adjusting unit shifts the phase of said main signal by a predetermined amount under control of said first control unit, while said control circuit repeats sequentially control of said first control unit, control under which said phase adjusting unit shifts the phase of a main signal by a predetermined amount, and control of said second control unit.

4. The feed-forward amplifying device according to claim 3, further comprising:
   a monitoring unit for monitoring a control abnormality and the level of an uncanceled signal, based on a signal from said distortion extracting loop circuit unit and a signal from said distortion removing loop circuit unit; and
   a control mode varying unit for forcibly varying said first controlling unit to a control mode when said monitoring unit has detected an abnormal state.

5. The feed-forward amplifying device according to claim 3, wherein said phase adjusting unit comprises:

a phase information setting unit for setting phase information on shifting the phase of said main signal by a predetermined amount in the form of an analog voltage;

an adder for analog-adding phase information set by said phase information setting unit to a phase control amount set by said first control unit and then outputting the result to said first variable phase shifter and variable attenuator; and a switch arranged between said phase information setting unit and said adder, for turning on to shift the phase of said main signal by a predetermined amount and turning off in other operations.

6. The feed-forward amplifying device according to claim 2, wherein said phase adjusting unit comprises:

a phase information storing unit for storing phase information on shifting the phase of said main signal by a predetermined amount;

a phase information adder for adding phase information from said phase information storing unit to a phase control amount sent from said first control unit to said first variable phase shifter and variable attenuator; and a phase adjusting and controlling unit for shifting the phase of said main signal by a predetermined amount according to the phase information added by said phase information adder.

7. The feed-forward amplifying device according to claim 2, wherein said phase adjusting unit comprises:

a phase information setting unit for setting phase information on shifting the phase of said main signal by a predetermined amount in the form of an analog voltage;

an A/D converter for A/D converting an analog voltage value set by said phase information setting unit;

a phase information adder for adding phase information A/D converted in said A/D converter to the phase control amount output from said first control unit to said first variable phase shifter and variable attenuator; and a phase adjusting and controlling unit for shifting the phase of said main signal by a predetermined amount, based on said phase information added by said phase information adder.

8. A method of controlling a feed-forward amplifying device, which includes a distortion extracting loop circuit unit having a main amplifier for amplifying a main signal in a main signal system, the distortion extracting loop circuit unit being operable to generate a distortion extracting signal, which is obtained by canceling the main component of an output from the main amplifier, by controlling the phase of said main signal, and a distortion removing loop circuit unit arranged at the rear stage of the main amplifier for producing a signal obtained by canceling the main signal component of said output from the main amplifier, based on said output of the main amplifier and said distortion extracting signal from the distortion extracting loop circuit unit, and producing only said main signal component from said main signal in the main signal system at the rear stage of said main amplifier using said signal obtained by canceling said main signal component of said output from the main amplifier, wherein said distortion extracting loop circuit unit executes a phase control at an optimum phase control point disposed within a maximum phase control point where said main signal component can be canceled to a maximum and a peak point where said main signal component can be input at a peak level, said optimum phase control point being located at a position toward said maximum phase control point and far away from said peak point.

9. The method of controlling feed-forward amplifying device according to claim 8, wherein control of the first variable phase-shifter/attenuator, control of the phase adjusting unit, and control of the second variable phase-shifter/attenuator are repeated sequentially.

10. A method of controlling a feed-forward amplifying device, which includes a distortion extracting loop circuit unit having a main amplifier for amplifying a main signal in a main signal system, a branching unit for branching said main signal at a front stage of the main amplifier, a first variable phase-shifter/attenuator for varying the phase and amplitude of a first main signal component branched by said branching unit to output the resultant signal to the main amplifier, an attenuator for receiving said main signal amplified by said main amplifier and then attenuating the amplified signal to its original level before amplified, a first delaying unit for delaying a second main signal component branched by the branching unit by a first predetermined time, and a first synthesizing unit for synthesizing a signal output from the attenuator with a signal from the first delaying unit, and a distortion removing loop circuit unit including a second delaying unit for delaying said amplified signal from the main amplifier by a second predetermined time, a second variable phase-shifter/attenuator for varying the phase and amplitude of said distortion extracting signal from the first synthesizing unit, an auxiliary amplifier for amplifying said distortion extracting signal from the second variable phase-shifter/attenuator with the same amplifying factor as that of the main amplifier, and a second synthesizing unit for synthesizing the delayed signal from said second delaying unit with the amplified signal from the auxiliary amplifier;

said method comprising the step of:

controlling the first variable phase-shifter/attenuator to vary said signal output from the first synthesizing unit into a distortion extracting signal obtained by setting the phase of said first main signal component to an optimum phase control point disposed within a range between a maximum phase control point where said first and second main signal components can be canceled to a maximum and a peak point where said first and second main signal components can be input at a peak level, said optimum phase control point being located at a point toward said maximum phase control point and far away from said peak point:

controlling shifting the phase of said main signal component, which is branched from said main signal by said branching unit, by a predetermined amount by the phase adjusting unit at optimum; and controlling the second variable phase-shifter/attenuator to vary said signal from the second synthesizing unit into only said main signal component obtained by best canceling components other than said main signal component at optimum.

11. The method of controlling a feed-forward amplifying device according to claim 9, further comprising the steps:

monitoring the steps of control and the level of an uncanceled signal based on said signal output from said distortion extracting loop circuit unit and said signal output from said distortion removing loop circuit unit; and if the monitoring unit has detected an abnormality, forcibly rendering the feed-forward amplifying device to assume a control mode to thereby shift the phase of said main signal back to said first phase control point perform said control of the first variable phase-shifter/attenuator.

12. A base station adapted to be wirelessly connected with plural mobile units for amplifying a common signal having plural frequency components, which are selected for every mobile unit and then transmitting the amplified signal at a frequency band to the individual mobile units, wherein said base station is equipped with a feed-forward amplifying device, which comprises:
- a distortion extracting loop circuit including a main amplifier for amplifying a main signal in the main signal system, said distortion extracting loop circuit unit being operable to produce a distortion extracting signal by controlling the phase of said main signal by canceling the main signal component of an output from said main amplifier; and
- a distortion removing loop circuit disposed at the rear stage of said main amplifier for outputting only said main signal component of the main signal in the main signal system at the rear stage of said main amplifier using said distortion extracting signal obtained by canceling said main signal component;
- said distortion extracting loop, circuit unit being operable to execute a phase control at a an optimum phase control point disposed within a range between a maximum phase control point where said main signal component can be canceled to a maximum and a peak point where said main signal component can be input at a peak level, said optimum phase control point being located at a position toward said maximum phase control point and far away from said peak point.

13. A base station adapted to be wirelessly connected with plural mobile units for amplifying a common signal having plural frequency components, which are selected for every mobile unit and then transmitting the amplified signal at a frequency band to the individual mobile units, wherein said base station is equipped with a feed-forward amplifying device, which comprises:
- a distortion extracting loop circuit including
  - a main amplifier for amplifying a main signal in the main signal system, a branching unit for branching a main signal in the main signal system into first and second main signal components at the front stage of said main amplifier,
  - a first variable phase-shifter/attenuator for varying the phase and amplitude of said first main signal component, which is branched from said main signal by said branching unit, to output the resultant signal to said main amplifier,
  - an attenuator for receiving said main signal amplified by said main amplifier and a pilot signal, which is supplied from a pilot signal producing unit adapted to be associated with said distortion extracting loop circuit, and then attenuating the resultant signals to their respective original levels before being amplified by said main amplifier,
  - a first delaying unit for delaying said second main signal component, which is branched from said main signal by said branching unit, by a first predetermined time, and
  - a first synthesizing unit for synthesizing the attenuated signal from said attenuator with the delayed signal from said first delaying unit to cancel said first and second main signal components and to thereby produce the resultant signal as a distortion extracting signal;
- a distortion removing loop circuit including:
  - a second delaying unit for delaying said first main signal component, which is amplified by said main amplifier, by a second predetermined time,
  - a second variable phase-shifter/attenuator for varying the phase and amplitude of said distortion extracting signal from said first synthesizing unit,
  - an auxiliary amplifier for amplifying said distortion extracting signal from said second variable phase-shifter/attenuator with the same amplifying factor as that of said main amplifier, and
  - a second synthesizing unit for synthesizing the delayed signal from said second delaying unit with the amplified signal from said auxiliary amplifier to cancel said distortion extracting signal and to thereby produce said main signal;
- a control circuit including:
  - a first control unit for controlling said first variable phase-shifter/attenuator to set the phase of said first main signal component, which is branched from said main signal by said branching unit, to a maximum phase control point where said first and second main signal components can be canceled to a maximum, and
  - a second control unit for controlling said second variable phase-shifter/attenuator after the control operation of said first control unit to cancel components other than the main signal component of said signal output from said second synthesizing unit so that only said main signal component is obtained; and
- a phase adjusting unit for shifting the phase of said first main signal component to an optimum phase control point disposed within a range between said maximum phase control point and a peak point where said first and second main signal components can be input at a peak level, said optimum phase control point being located at a position toward said maximum phase control point and far from said peak point.

* * * * *

UNITED STATES PATENT AND TRADEMARK OFFICE
CERTIFICATE OF CORRECTION

PATENT NO : 6,148,185
DATED : NOVEMBER 14, 2000
INVENTOR(S) : SATOSHI MARUYAMA, ET AL.

It is certified that error appears in the above-identified patent and that said Letters Patent are hereby corrected as shown below:

Please correct assignor name: NORIO TAZAWA to NORIO TOZAWA.

Signed and Sealed this

Eighth Day of May, 2001

NICHOLAS P. GODICI

*Attest:*

*Attesting Officer*  *Acting Director of the United States Patent and Trademark Office*